(12) United States Patent
He et al.

(10) Patent No.: US 12,074,530 B2
(45) Date of Patent: Aug. 27, 2024

(54) SYSTEMS AND METHODS FOR CONTROLLING WIND CONVERTERS

(71) Applicant: General Electric Company, Schenectady, NY (US)

(72) Inventors: Lijun He, Schenectady, NY (US); Honggang Wang, Clifton Park, NY (US); Alexandre Lagarde, Gif sur Yvette (FR); Virginie Peron, Vertou (FR); Raphael de Rocca-Serra, Nantes (FR); Arvind Kumar Tiwari, Niskayuna, NY (US); Liwei Hao, Niskayuna, NY (US)

(73) Assignee: GENERAL ELECTRIC RENOVABLES ESPAÑA, S.L., Barcelona (ES)

( * ) Notice: Subject to any disclaimer, the term of this patent is extended or adjusted under 35 U.S.C. 154(b) by 827 days.

(21) Appl. No.: 16/676,192

(22) Filed: Nov. 6, 2019

(65) Prior Publication Data

US 2021/0131400 A1    May 6, 2021

(51) Int. Cl.
*H02M 5/458* (2006.01)
*F03D 9/25* (2016.01)
(Continued)

(52) U.S. Cl.
CPC ............ *H02M 5/458* (2013.01); *F03D 9/255* (2017.02); *G01R 31/2617* (2013.01);
(Continued)

(58) Field of Classification Search
CPC ...... F03D 7/0272; F03D 7/0292; F03D 7/045; F03D 9/255; F05B 2270/3032;
(Continued)

(56) References Cited

U.S. PATENT DOCUMENTS 5,428,357 A * 6/1995 Haab ..................... G01D 9/00
341/155
8,600,685 B2    12/2013 Kalgren et al.
(Continued)

FOREIGN PATENT DOCUMENTS

CN       107341326 A    11/2017
CN       105431745 B    11/2018
(Continued)

OTHER PUBLICATIONS

Musallam et al., "Mission Profile-Based Reliability Design and Real-Time Life Consumption Estimation in Power Electronics", IEEE Transactions on Power Electronics, pp. 2601-2613, vol. 30, Issue: 5, Sep. 17, 2014.
(Continued)

*Primary Examiner* — Kyle R Quigley
(74) *Attorney, Agent, or Firm* — Dority & Manning, P.A.

(57) ABSTRACT

A method of operating a wind converter is provided. The method includes receiving a plurality of forecasted datasets. The forecasted datasets include event signals for the wind converter during fast transient operating conditions (OCs) and operational data for the wind converter having a low sampling rate. The method further includes estimating a converter life consumption during normal OCs and a converter life consumption during the fast transient OCs. Further, the method includes computing a total converter life consumption of the wind converter. Moreover, the method includes predicting, using a remaining useful life (RUL) prediction module, an RUL for the wind converter based on the total converter life consumption. The method further includes adjusting operation of the wind converter by adjusting operating variables of the wind converter.

12 Claims, 14 Drawing Sheets

(51) Int. Cl.
  *G01R 31/26* (2020.01)
  *G05B 13/04* (2006.01)
  *G05B 23/02* (2006.01)
  *H02J 3/38* (2006.01)

(52) U.S. Cl.
  CPC ......... *G01R 31/2642* (2013.01); *G05B 13/04* (2013.01); *G05B 23/0283* (2013.01); *H02J 3/381* (2013.01); *H02J 2300/28* (2020.01)

(58) Field of Classification Search
  CPC .......... F05B 2270/332; G01R 31/2617; G01R 31/2642; G05B 13/04; G05B 23/0283; H02J 2300/28; H02J 3/381; H02J 3/386; H02M 5/458
  See application file for complete search history.

(56) References Cited

U.S. PATENT DOCUMENTS

| | | | |
|---|---|---|---|
| 9,287,766 B2 | 3/2016 | Wagoner et al. | |
| 9,529,037 B2 | 12/2016 | Thogersen et al. | |
| 9,605,654 B2 | 3/2017 | Wickstrom | |
| 9,998,030 B2 | 6/2018 | Wei et al. | |
| 2010/0298995 A1* | 11/2010 | Zhang | F03D 7/042 700/287 |
| 2010/0332272 A1* | 12/2010 | Ong | G06Q 10/20 705/305 |
| 2014/0030089 A1* | 1/2014 | Wickstrom | F03D 7/042 416/1 |
| 2017/0350934 A1 | 12/2017 | Sathik et al. | |
| 2018/0171979 A1* | 6/2018 | Spruce | F03D 7/0292 |
| 2018/0180025 A1* | 6/2018 | Spruce | F03D 17/00 |
| 2018/0187648 A1* | 7/2018 | Spruce | F03D 7/048 |
| 2018/0292467 A1 | 10/2018 | Rannestad | |

FOREIGN PATENT DOCUMENTS

| | | |
|---|---|---|
| ES | 2396533 B1 | 1/2014 |
| WO | 2019107075 A1 | 6/2019 |
| WO | WO 2019/185560 A1 | 10/2019 |

OTHER PUBLICATIONS

Nicolas et al., "A Review of Prognostics and Health Management for Power Semiconductor Modules", Annual Conference of the Prognostics and Health Management Society 2015, pp. 1-11, 2015.

Xu et al., "Reliability Odometer of Power Semiconductor Device used for High Performance High Power Amplifiers", 2016 IEEE Energy Conversion Congress and Exposition (ECCE), pp. 1-5, Milwaukee, WI, Sep. 2016.

Zhang et al., "Consumed Lifetime Estimation of DFIG Power Converter with Constructed High-Resolution Mission Profile", Proceedings of 2018 20th European Conference on Power Electronics and Applications, pp. 1-10, Latvia, Sep. 2018.

Dragicevie, Tomislav et al., "Artifical Intelligence Aided Automated Design for Reliability of Power Electronic Systems" IEEE Transactions on Power Electronics, Aug. 2019, pp. 7161-7171, vol. 34, No. 8.

EPO Search Report, Mar. 25, 2021.

Diego Coronado et al.—Condition Monitoring of Wind Turbines: State of the Art, User Experience and Recommendations Project Report, Jan. 1, 2015, pp. 36-37.

* cited by examiner

SYSTEMS AND METHODS FOR CONTROLLING WIND CONVERTERS

BACKGROUND

The field of the disclosure relates generally to systems and methods of operating a wind converter, and more particularly, to systems and methods of operating a wind converter to meet a target lifetime while improving performance.

In a power electronics system, semiconductors and capacitors are susceptible to failure over the lifetime of the system. For offshore converters, semiconductor failures may be more prevalent than capacitor failures. For example, a wind converter phase module may be relatively susceptible to failure, and may be costly to replace.

Wind converter fatigue-related failures are relatively rare for recently-commissioned fleet of wind converters. Life fatigue issues for wind converters may become significant in the future due to severe wind conditions, frequent converter tripping events, and other anomalies for offshore wind farms. Accordingly, accurate online lifetime monitoring for wind converters is desirable, but is either unavailable or relatively expensive using at least some known systems.

BRIEF DESCRIPTION

In one aspect, a method of operating a wind converter is provided. The method includes receiving a plurality of forecasted datasets, wherein the plurality of forecasted datasets include event signals for the wind converter during fast transient operating conditions (OCs) and operational data for the wind converter having a relatively low sampling rate. The method further includes estimating, using a normal OC life estimation module, a converter life consumption during normal OCs based on the operational data. The method also includes estimating, using a fast transient OC life estimation module, a converter life consumption during the fast transient OCs based on the plurality of forecasted datasets. Further, the method includes computing, using a hybrid life estimation module, a total converter life consumption of the wind converter by combining the estimated converter life consumption during the normal OCs and the estimated converter life consumption during the fast transient OCs. Moreover, the method includes predicting, using a remaining useful life (RUL) prediction module, an RUL for the wind converter based on the total converter life consumption. The method also includes comparing the predicted RUL with a target RUL for the wind converter. The method further includes adjusting, using an active life performance control module, operation of the wind converter based on the comparison by adjusting operating variables of the wind converter.

In another aspect, a method of operating a wind converter is provided. The method includes receiving a plurality of datasets, wherein the plurality of datasets include event signals of the wind converter during fast transient OCs and operational data of the wind converter having a relatively low sampling rate. The method further includes estimating, using a normal OC life estimation module, a converter life consumption of the wind converter during normal OCs based on the operational data. The method also includes estimating, using a fast transient OC life estimation module, a converter life consumption of the wind converter during the fast transient OCs based on the plurality of datasets. Further, the method includes computing, using a hybrid life estimation module, a total converter life consumption of the wind converter by combining the estimated converter life consumption during the normal OCs and the estimated converter life consumption during the fast transient OCs. Moreover, the method includes monitoring, remotely and in real time, operation of the wind converter based on the computed total converter life consumption.

In yet another aspect, a real-time remote operation monitor and control system of a wind converter is provided. The real-time remote operation monitor and control system of a wind converter includes a wind converter, a remaining useful life (RUL) prediction module, and an active life performance control module. The RUL prediction module includes a hybrid life estimation module. The hybrid life estimation module is configured to receive a plurality of datasets, wherein the plurality of datasets include event signals for the wind converter during fast transient OCs and operational data of the wind converter having a relatively low sampling rate. The hybrid life estimation module includes a normal OC life estimation module and a fast transient OC life estimation module. The normal OC life estimation module is configured to estimate a converter life consumption during normal OCs based on the operational data. The fast transient OC life estimation module is configured to estimate a converter life consumption during the fast transient OCs based on the plurality of datasets. The hybrid life estimation module is further configured to compute a total converter life consumption of the wind converter by combining the estimated converter life consumption during the normal OCs and the estimated converter life consumption during the fast transient OCs. The RUL prediction module is configured to predict an RUL for the wind converter based on the total converter life consumption computed using the hybrid life estimation module. The active life performance control module is configured to adjust operation of the wind converter based on a comparison of the predicted RUL with a target RUL for the wind converter by adjusting operating variables of the wind converter.

DRAWINGS

DETAILED DESCRIPTION

Figure 1A:
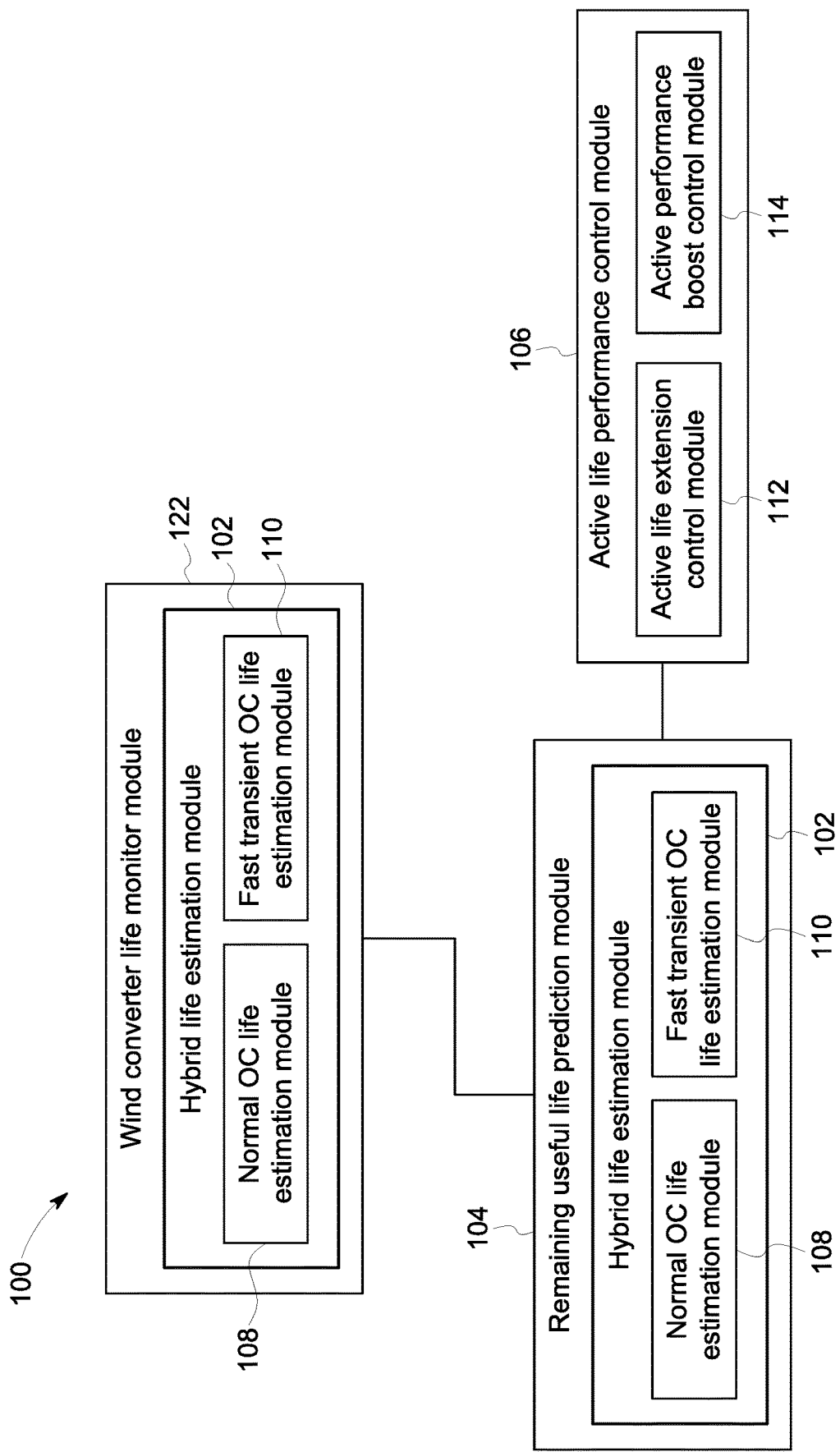
FIG. 1A is a schematic diagram of an exemplary wind converter monitoring and control system.

The disclosure includes systems and methods for life monitoring a wind converter, predicting a remaining useful life (RUL), and controlling life performance based on a hybrid life estimation, in real-time. The systems and methods described herein can be applied to readily available wind turbine operational data that has a low sampling rate (e.g. Global Repository (GR) data collected at an interval of 10 minutes). The systems and methods described herein do not require any loss/thermal parameters from converter suppliers or extra hardware for implementation. Further, the control algorithm is relatively fast and alleviates computational burdens. The methods and systems disclosed herein also seamlessly integrate a "life extension control mode" if stress or usage of the wind converter is relatively high and a "performance boost control mode" if stress or usage is relatively low into one life performance control module, and can automatically switch between these two modes in real-time based on customer needs. The systems and methods described herein can also be applied to wind turbines in a fleet to balance power among the turbines such that the fleet of wind converters has homogenous aging based on a targeted lifetime for the entire fleet.

Life fatigue issues for wind converters may become significant due to severe wind conditions, frequent converter tripping events, and other anomalies at offshore wind farms. Therefore, it is important to provide accurate online lifetime monitoring for a wind converter over the entire lifetime of the equipment. For wind converters, online junction temperature monitoring and life consumption monitoring are generally unavailable, or relatively expensive. Therefore, there is a need for online estimation of converter junction temperature and life monitoring using readily available low sampling rate operational data.

Wind converter phase modules significantly contribute to wind turbine down time, and converter phase module life failures are generally related to semiconductor components. Two prevalent failure modes are semiconductor wire bond crack/lift-off, and solder crack/delamination. Both failure modes are fatigue-related and caused by thermal-electrical stress generated during power/thermal cycles.

Variations in junction temperatures represent thermal cycles, and are indicators of thermal stress and life consumption. Junction temperature can be measured using an optical measurement device, such as an infrared (IR) camera or a physical measurement device, such as resistance temperature detectors (RTDs) or thermocouples. These methods, however, require extra sensors pre-installed with the semi-conductor component, which may not be practical for commercial converter products.

Junction temperature can also be estimated indirectly. Estimation technologies can be classified into two categories. One category includes estimating junction temperature through temperature-sensitive-electric-parameters (TSEP), e.g. $V_{CEon}$, $V_{ge,th}$, $V_{ge,off}$, and $I_{sat}$. TSEP measurements, however, require an additional measurement circuit, and therefore may be difficult to implement on commercial converter products. The other category of technologies includes estimating junction temperature using dynamic thermal resistor-capacitor (RC) network estimation. Accurate thermal RC network estimation requires detailed loss data for each semiconductor, e.g. insulated-gate bipolar transistor (IGBT) or diodes, and thermal RC parameters for the entire power module, which may be challenging to obtain. Further, this category of technologies also requires operational data having a relatively high sampling-rate (at least around the level of seconds) throughout the converter's entire life due to high turbulence of wind conditions, and also requires relatively large computational power because for example, semiconductor loss calculation is carried out at a microsecond level. These requirements are difficult to meet because an original equipment manufacturer (OEM) can only provide continuously-recorded converter data at pre-determined sampling intervals (e.g., every ten minutes), and there is generally limited computational capability for cloud-based analytics.

Therefore, there is a need for a converter life estimation solution that can be directly applied to readily available low sampling-rate wind turbine operational data (e.g., GR data collected at an interval of 10 minutes), and that is parameter free, fast, and has a relatively low computational burden.

As used herein, low sampling rate operational data is data for operational parameters, such as power, voltage, temperature, and flow-rate, that reflects the operating status of the wind converter and is acquired at intervals on the order of minutes or longer time interval. Low sampling rate operational data may be collected by OEMs. Compared to mission profile data, which represents power output of the wind converter and varies every several seconds or sub-seconds and is usually sampled at a relatively high sampling rate, such as 20 Hz, the sampling rate or sampling frequency of low sampling rate operational data is relatively low, such as every 10 minutes. Low sampling rate operational data used herein may include statistics, such as means or standard deviations, of operational data. It may also include other statistics of the given operational data, e.g. kurtosis, skewness, mode, median, quartile, minimum, maximum, range, and interquartile range. For example, low sampling rate operational data of power may be a time series of power values having data points every 10 minutes, where each data point is based on power data having a high sampling rate (e.g. 20 Hz) and duration of 10 minutes and includes a mean, a standard deviation, a maximum, and/or a minimum of power over this 10-minute duration.

In addition to low sampling rate operational data, event signals for the wind converter are also incorporated in the systems and methods described herein. Event signals may also have a low sampling rate, like low sampling rate operational data. Tripping of semiconductors and sudden changes in wind speed constitute events and fast transient conditions relative to a duration of time on the order of minutes. Signals for such occurrences are referred to herein as event signals.

The systems and methods described herein use low sampling rate operational data and event signals to estimate life consumption of a wind converter. Life consumption is the percentage of lifetime that a wind converter has consumed. The minimum value for life consumption is 0%, which corresponds to the wind converter having never been used. In contrast, the maximum for life consumption is 100%, which corresponds to the wind converter having reached the end of its life. In estimating life consumption, a hybrid estimation model may be used that combines a normal operating condition (OC) life estimation module using a surrogate model and a fast transient OC life estimation module using a physical-based or surrogate model for estimating life consumption when the wind converter operates at fast transient OCs. A physical-based model may also be referred to as an analytical model. The surrogate model may be a neural-network based model that was previously trained. A physical-based model, on the other hand, is based on calculations and physical relations between operational data and event signals and maximum junction temperatures and life consumption. The input data of a physical-based model may have a relatively high sampling rate (e.g., 20 Hz). Although not directly related to life consumption, maximum junction temperatures are also indicators of the wind converter's performance. If maximum junction temperatures are too high, the wind converter may need to be shut down.

The hybrid estimated life estimation module may be used to monitor life of the wind converter. In monitoring life of a wind converter, the life estimation process may be repeated for each time point of low sampling rate data. That is, life consumption starts as 0% and data points at a first time point are processed to estimate a change in the life consumption. Once these data points are processed, the estimated change in life consumption is added to the total life consumption up to a previous time point, and then data points at the next time point are processed. This process is repeated iteratively until data at all time points have been processed.

It also may be used to compute RUL and control the performance of the wind converter based on the computed RUL, where operating parameters of the wind converter are adjusted to either extend the life of the wind converter or boost the performance of the wind converter while still meeting a target life. A target life may be specified by the OEM. RUL is the remaining life of the wind converter expressed in units of time such as months or years. Low sampling rate operational data and event signals are also used to estimate RUL, but for the purpose of estimating RUL, the time series of operational data and event signals may need to be lengthened to a longer duration. For example, to lengthen the time series data, low sampling rate operational data and event signals may be input into a forecast function that generates data points in the future based on current data points and on assumptions of the trends in current data points. Similar to a converter life monitor application, estimation of RUL also uses a hybrid life estimation model and an iterative process, except that an RUL is the output instead of present life consumption. An RUL is calculated based on life consumption using assumptions, such as a linear assumption where the wind converter ages at the same pace throughout its life. Once the RUL is estimated, operating parameters of the wind converter are optimized to minimize differences between the RUL and a target remaining life. The optimized operating parameters are then used to adjust operations of the wind converter.

FIG. 1A shows a schematic diagram of an exemplary real-time remote operation monitoring and control system 100 of a wind converter. System 100 includes a wind converter life monitor module 122, a converter RUL prediction module 104, and an active life performance control module 106. Wind converter life monitor module 122 is used to monitor life consumption of the wind converter. Converter RUL prediction module 104 is used to predict the RUL of the wind converter. Both wind converter life monitor module 122 and converter RUL prediction module 104 may further include a hybrid life estimation module 102 to estimate total life consumption of the wind converter. Module 102 uses a hybrid life estimation algorithm to estimate total life consumption of the wind converter. Hybrid life estimation module 102 includes a normal OC life estimation module 108, and may further include a fast transient OC life estimation module 110. Active life performance control module 106 is used to adjust operation of the wind converter based on the estimated RUL that reflects stress conditions of the wind converter, target converter life of the wind converter, and/or customer needs. Active life performance control module 106 may further include an active life extension control module 112 to extend the wind converter's life and an active performance boost control module 114 to boost the wind converter's performance while still meeting the target life. System 100 or its individual modules may be implemented online, where the system or module is web-based and takes in online-deposited data as input. System 100 or its individual modules may also be implemented directly on a computing device, where the computing device receives and sends data wirelessly or via wired communication.

Figure 1B:
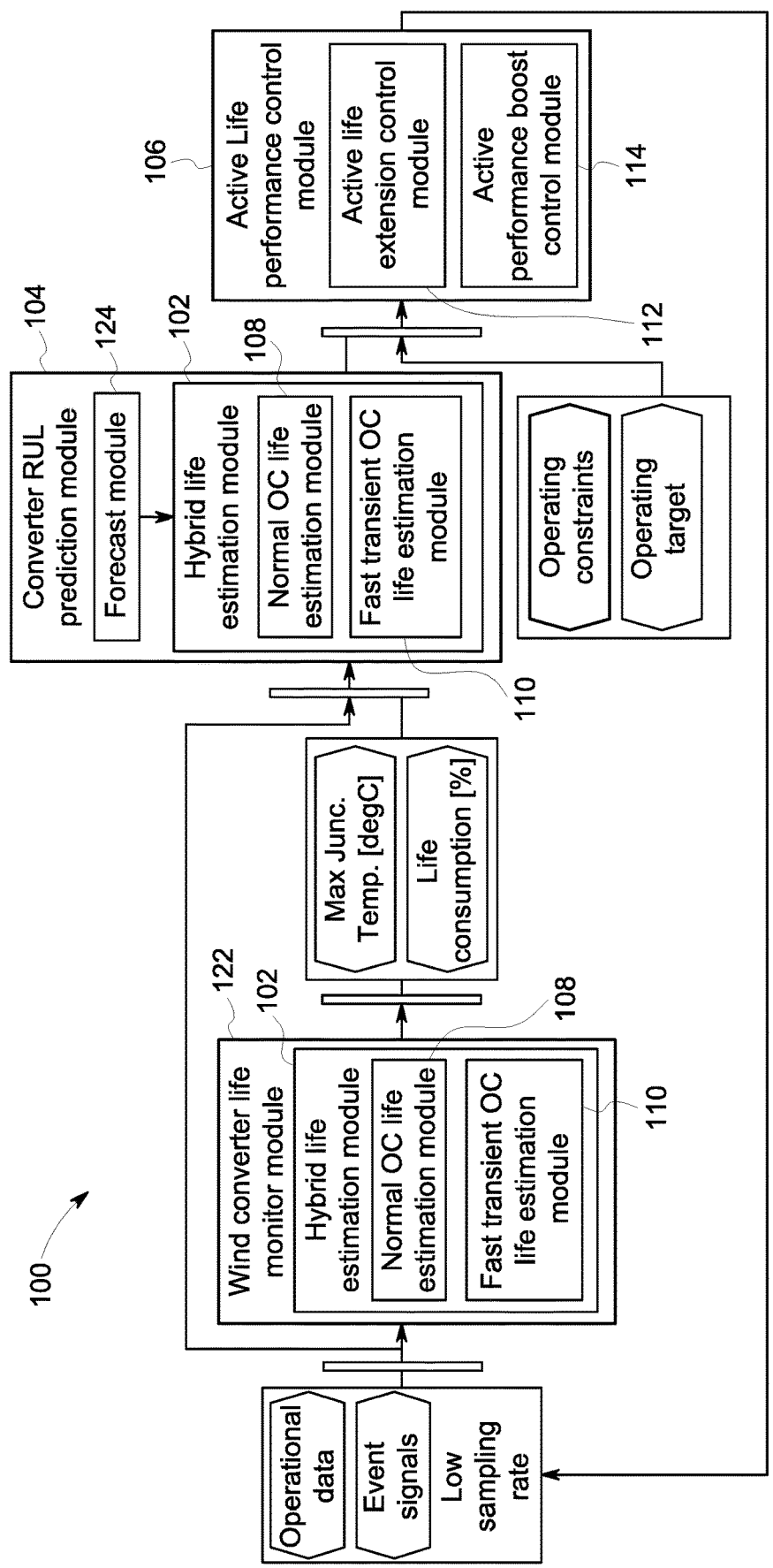
FIG. 1B is a schematic diagram illustrating operation of the monitoring and control system shown in FIG. 1A to monitor the performance of a wind converter and adjust the operation of the wind converter.

FIG. 1B is a schematic diagram illustrating operation of system 100 to monitor the performance of a wind converter and control the operation of the wind converter. To monitor the performance of the wind converter, in wind converter life monitor module 122, hybrid life estimation module 102 is used to estimate life consumption of the wind converter at each input dataset. Hybrid life estimation module 102 includes normal OC life estimation module 108 and fast transient OC life estimation module 110, and fuses the results from the two modules 108, 110 to derive a combined life estimation result. Hybrid life estimation module 102 takes low sampling rate operational data and event signals as inputs for each dataset, and generates outputs that include maximum junction temperatures and life consumption.

In the exemplary embodiment, to predict RUL and/or control operation of the wind converter, low sampling rate operational data and event signals are also used. For estimating RUL, time series of operational data and event signals may need to be lengthened. For example, before being inputted into hybrid life estimation module 102, operational data and event signals may be fed into a forecast module 124 of converter RUL prediction module 104 to predict and lengthen the time series of operational data and event data by applying a forecast function to generate forecasted datasets. Using forecasted datasets, hybrid life estimation module 102 predicts RUL of the wind converter. The predicted RUL, together with operational constraints, operating targets (e.g., converter lifetime target and power boost target), may be input into active life performance control module 106 to control operation of the wind converter. Active life performance control module 106 adjusts the operation of the wind converter based on those parameters, switching between active life extension control module 112 to extend the life of the wind converter when converter stress or usage is relatively high and active performance boost control module 114 to boost the performance of the wind converter when converter stress or usage is relatively low. As part of a feedback loop, active life performance control module 106 also provides desired operational data as inputs to wind converter.

Figure 2A:
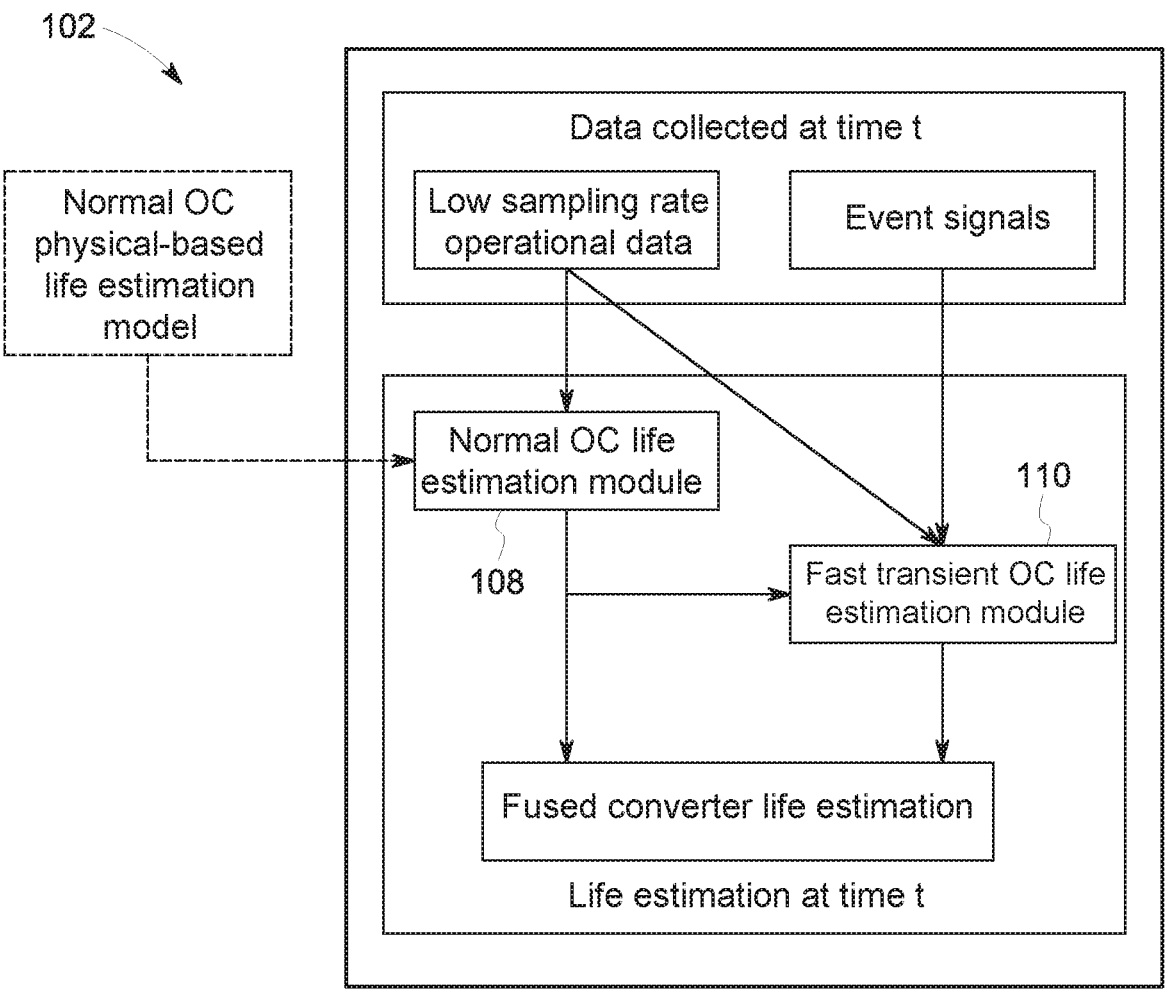
FIG. 2A is a block diagram illustrating an exemplary hybrid life estimation module of the system shown in FIG. 1A.
Figure 2B:
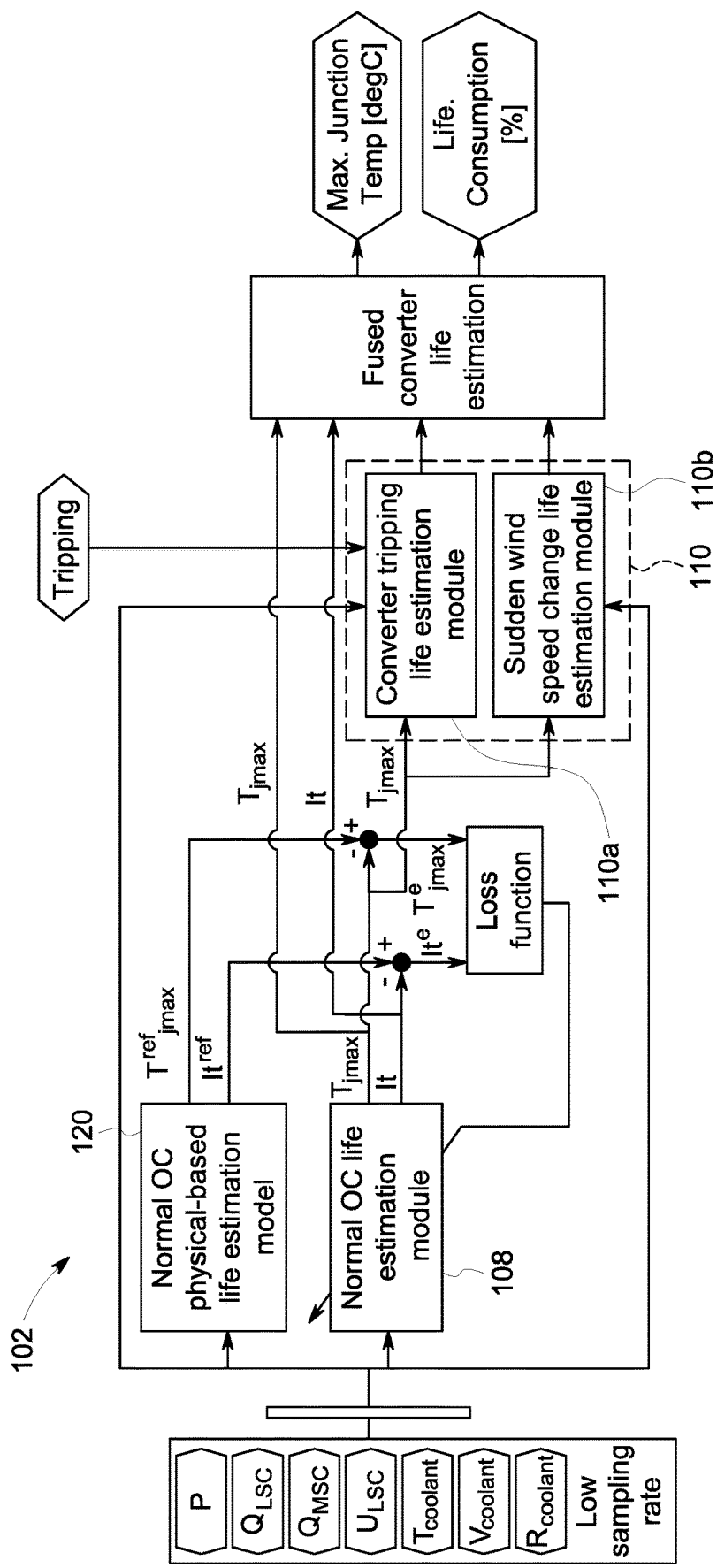
FIG. 2B is a schematic diagram of the hybrid life estimation module shown in FIG. 2A.

FIGS. 2A and 2B show an exemplary hybrid life estimation module 102 for a wind converter, when one dataset is given. FIG. 2A is a block diagram of module 102 and FIG. 2B is a schematic diagram of module 102 including input data and data flow. Hybrid life estimation module 102 includes normal OC life estimation module 108, where a surrogate model is used. The surrogate model may be trained using data generated from a normal OC physical-based life estimation model 120. Hybrid life estimation module 102 may further include fast transient OC life estimation module 110, which includes a converter tripping life estimation module 110a and a sudden wind speed change life estimation module 110b. Fast transient OC life estimation module 110 may be used to estimate life consumption caused by fast transient events other than tripping and sudden changes in wind speed.

In operation, normal OC life estimation module 108 using a surrogate model takes one dataset of low sampling rate operational data as inputs and outputs estimated maximum junction temperatures and life consumption during normal OCs. Fast transient OC life estimation module 110 takes one dataset of low sampling rate operational data and event signals, together with maximum junction temperatures estimated by normal OC life estimation module 108, as input and outputs life consumption during fast transient OCs. The life consumption estimated from normal OC life estimation module 108 using surrogate model and fast transient OC life estimation module 110 using a physical-based model or a surrogate model is fed into a fused converter life estimation module. Therefore, hybrid life estimation module 102 outputs maximum junction temperatures and life consumption during all OCs.

Hybrid life estimation module 102 may be implemented online by receiving wind converter data remotely or implemented directly on a computing device. System 100 including hybrid life estimation module 102 can be implemented using low sampling rate data. Low sampling rate data as used herein has a relatively low sampling rate which may include statistics, as compared to the variation or turbulence of mission profile data of a wind converter. For example, mission profile data may have duration of 10 minutes, vary every several seconds, and be sampled at 20 Hz, while the data used herein may only include statistics of the entire 10 minute data. In the contemplated embodiment, hybrid life estimation module 102 is applied to a dataset of readily available low sampling-rate wind turbine operational data (e.g. GR data collected at an interval of 10 minute) and event signals. Further, hybrid life estimation module 102 does not require a loss/thermal parameter from a converter supplier or extra components to estimate life consumption of the wind converter, and is extreme fast and alleviate computation burden.

Figure 3A:
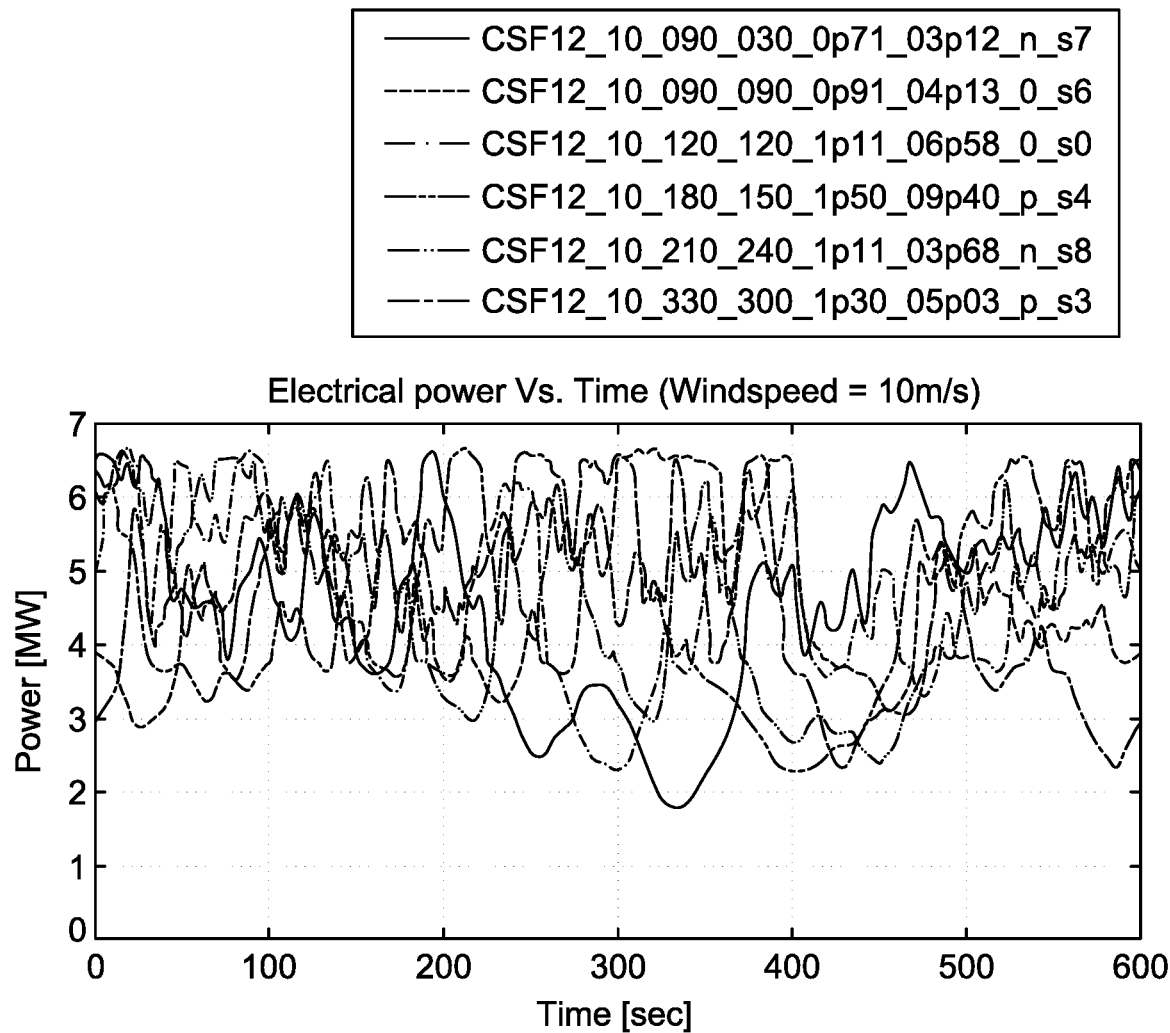
FIG. 3A is a graph illustrating an example of wind mission profiles at wind speed of 10 meters per second (m/s).
Figure 3B:
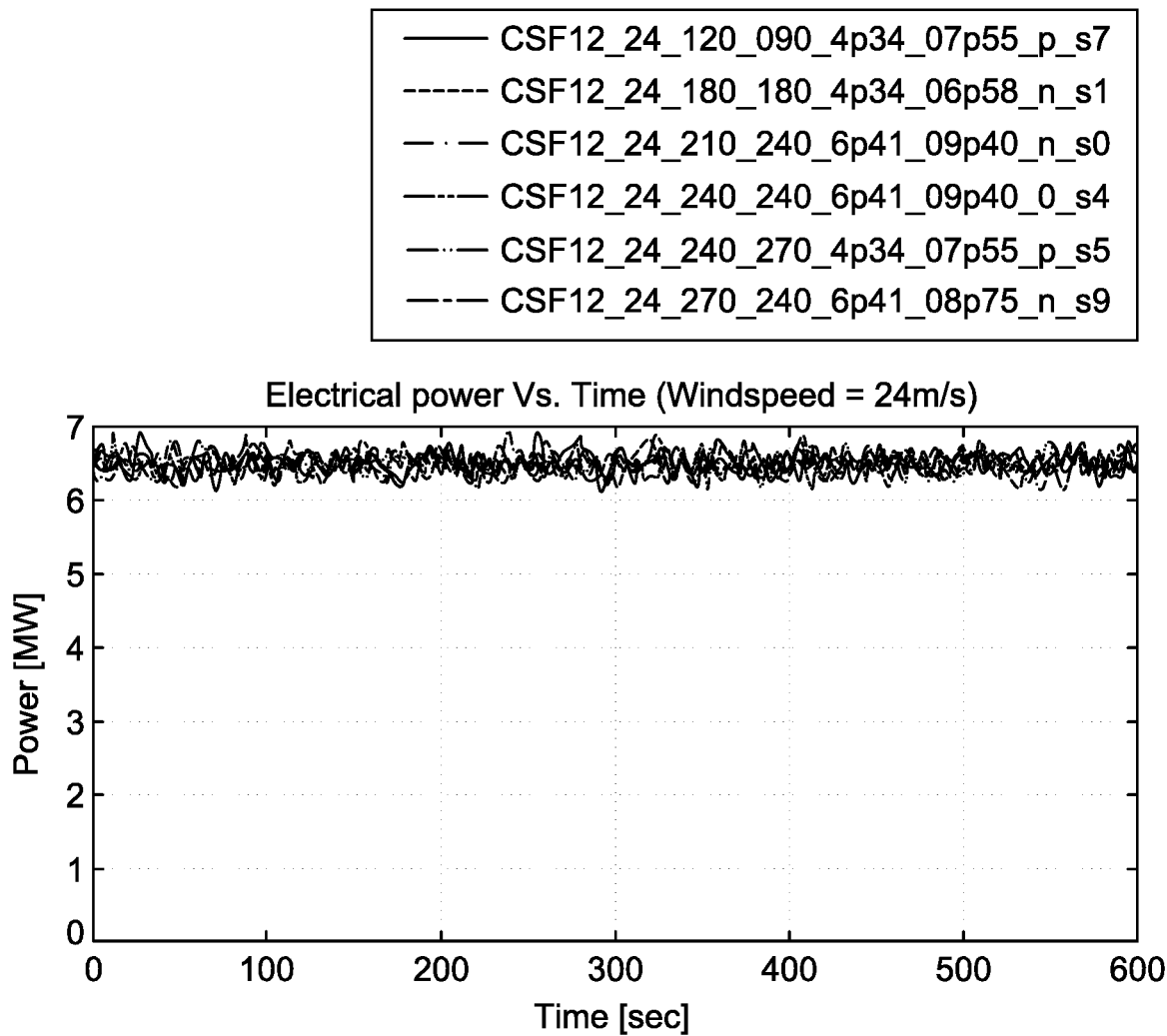
FIG. 3B is a graph illustrating an example of wind mission profiles at wind speed of 24 m/s.

In the exemplary embodiment, normal OC life estimation module 108 includes a surrogate model. The surrogate model was trained and tested before being used to estimate life consumption and/or maximum junction temperatures. In one example, normal OC physical-based life estimation model 120 is used to generate training and testing datasets for the surrogate model. Module 120 provides results of physical-based converter life estimation for a given period (e.g. 10 minutes). The results include converter junction temperature estimation (e.g., in ° C.) and life estimation (e.g., in %) during normal OCs. The results are based on wind mission profiles at different wind speed conditions (e.g. 4 meters per second (m/s) to 26 m/s) and other operating/design parameters for a given period (e.g. 10 minutes). Operating/design parameters may include wind machine-side/line-side converter active power/reactive power, pulse width modulation (PWM) switching frequencies, fundamental AC frequencies, AC RMS voltage, direct current (DC) bus voltage, coolant temperature, coolant flow rate, and coolant ratio. Graphs illustrating two examples of wind mission profiles at wind speed of 10 m/s and 24 m/s for a 10-minute period are provided in FIGS. 3A and 3B, for which wind mission profiles were sampled at 20 Hz. The wind profiles shown in FIG. 3A have greater variations over time than those shown in FIG. 3B, indicating that the wind profiles shown in FIG. 3A have more thermal cycles, and thus faster life consumption, than those shown in FIG. 3B.

Normal OC physical-based life estimation model 120 may include a semiconductor loss calculation module, a thermal RC network module, and a life time counting module. The life time counting module may use a counting algorithm to calculate life consumption. Module 120 provides power loss, junction temperature, and life consumption estimation for all semiconductor devices of the power converter.

Figure 4:
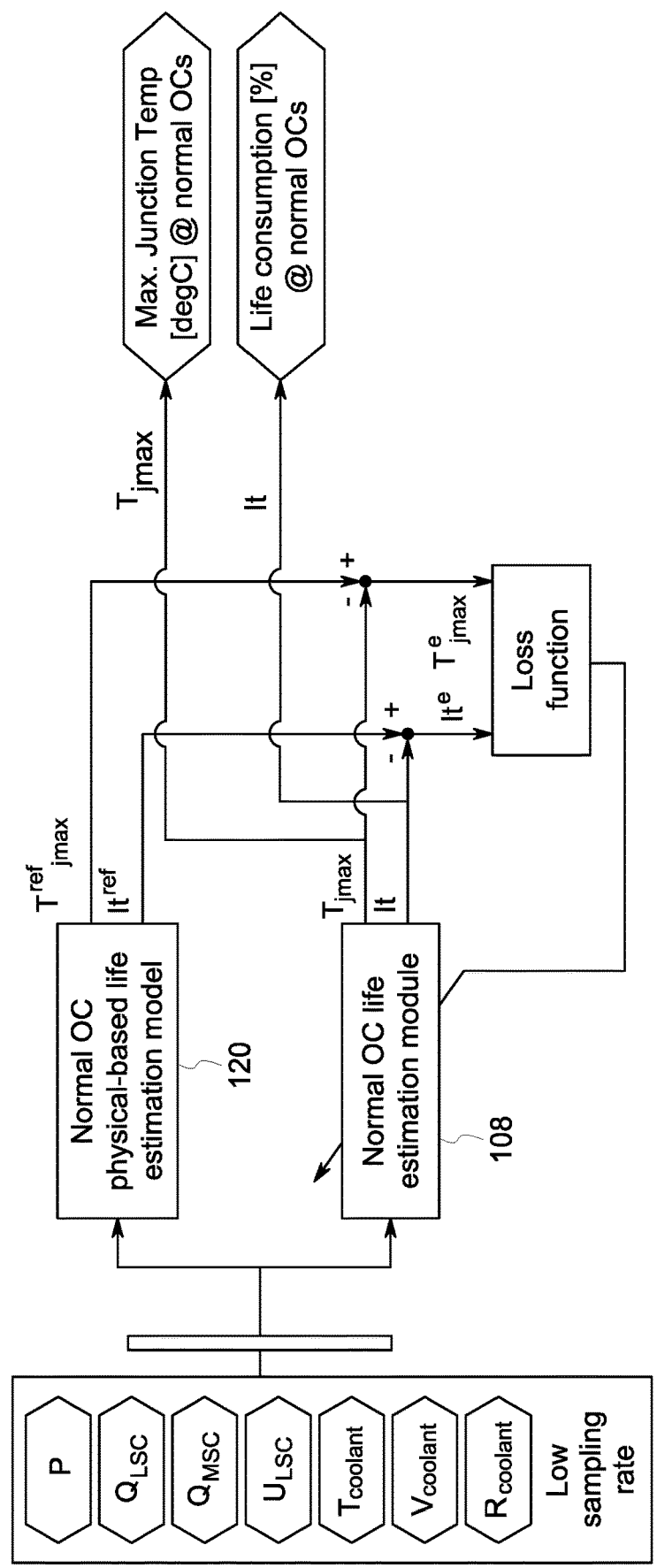
FIG. 4 is a schematic diagram illustrating an exemplary training process of a normal OC life estimation module using a surrogate model.

FIG. 4 is a schematic diagram illustrating an exemplary training process of a surrogate model used for normal OC life estimation module 108. The surrogate model is trained using low sampling rate wind converter operational data as an input and maximum junction temperatures and life consumption obtained by normal OC physical-based life estimation model 120 as targeted outputs. The predicted output from 108 is compared with the targeted output from module 120, and the residual or error between the targeted output and predicted output is calculated in loss function and is used to tune the parameters inside the surrogate model and to reduce the residual or error and improve accuracy of the surrogate model.

In some embodiments, design parameters (DPs) such as $f_{PWM,\ LSC}$ and $f_{PWM}$, MSC are fixed at certain frequencies, e.g., 4000 Hz and 2000 Hz respectively, and may not be considered as input variables. If different design parameters, e.g. PWM frequencies, are used as inputs, different surrogate models may be constructed and trained separately. In one embodiment, $f_{MSC}$ (equivalent wind generator speed) is correlated with active power P at each instantaneous time point according to a defined power curve at a given wind site, and therefore may not be treated as an independent input variable.

Normal OC life estimation module 108 may use different types of surrogate models, such as polynomial response surfaces, radial basis function, support vector machines, and artificial neural networks. An artificial neural networks model such as shallow feedforward neural networks, deep feedforward neural networks, recurrent neural networks, and long short-term memory, may be used. As another example, multiple neural networks forming a neural network ensemble may also be used.

In the exemplary embodiment, the surrogate model used for normal OC life estimation module 108 uses operational data and results from the physics-based converter life estimation for training an approximation model to estimate life consumption and maximum temperatures (see FIGS. 2A and 2B). If only normal OC physical-based life estimation model 120 is used in estimating life consumption and maximum temperatures for normal OCs, module 120 cannot be applied with low sampling rate operational data, and it may lead to large computational burdens (for example, semiconductor loss calculation is carried out in a microsecond level), and may affect the real-time performance of the method. In comparison, the computational burdens for the surrogate model described herein are alleviated by using data at low sampling rates and constructing an approximation model such as a surrogate model. The computation in the surrogate model used for converter normal OC life estimation module 108 is, therefore, relatively fast. For example, the computation can be completed within milliseconds or seconds, depending on the data volume. In addition, using a surrogate model also eliminates the needs to use any loss/thermal parameters from a converter supplier or additional hardware.

Figure 5A:
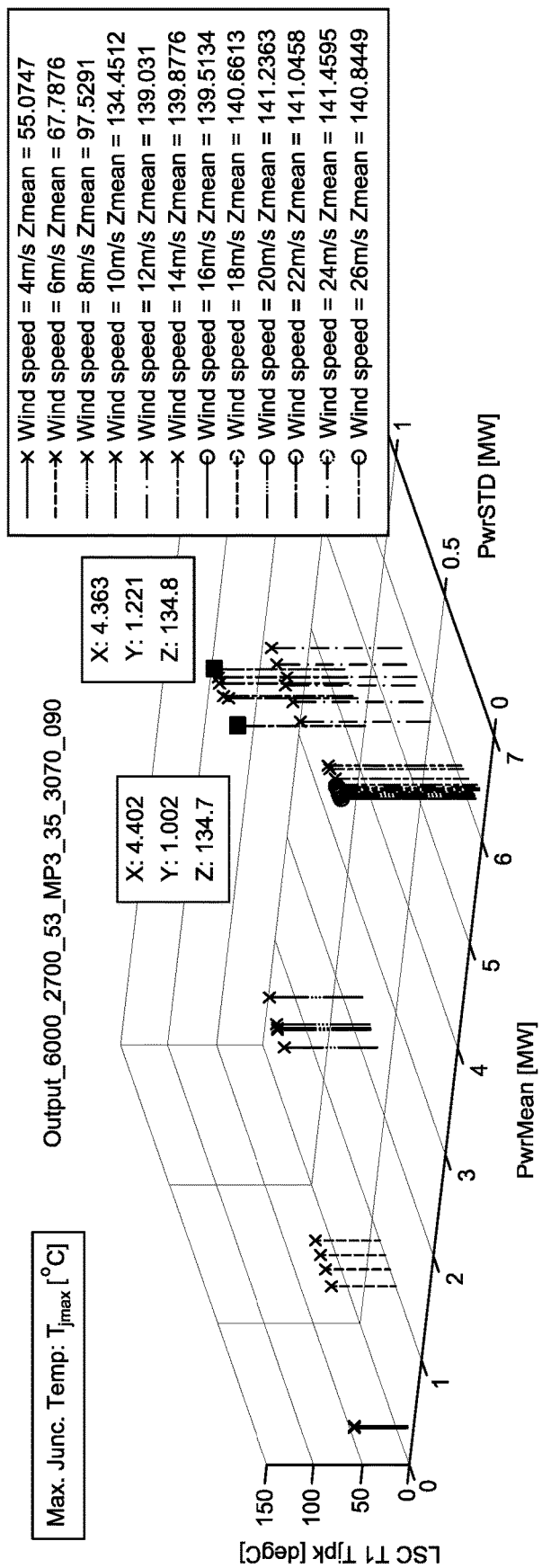
FIG. 5A is a graph illustrating a maximum converter junction temperature in relation to a mean and a standard deviation calculated from a wind mission profile.
Figure 5A:
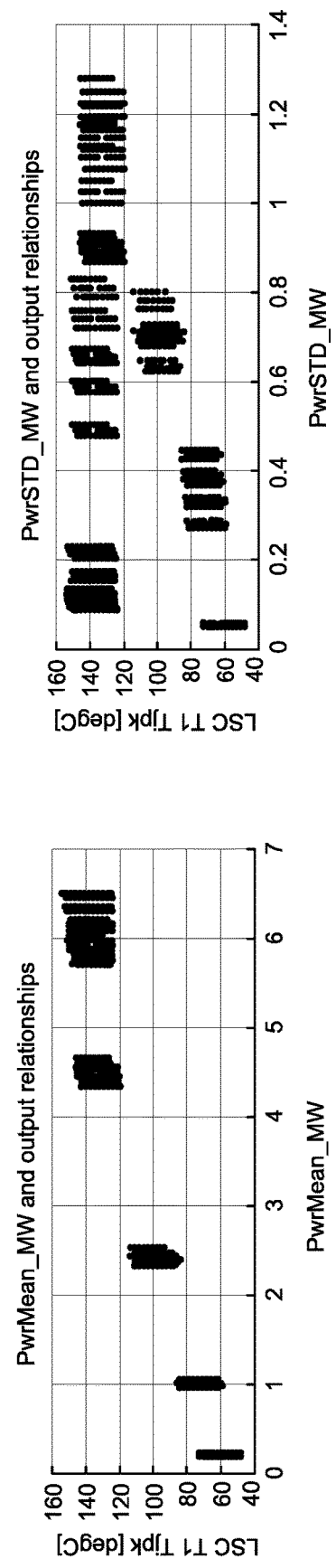
Figure 5B:
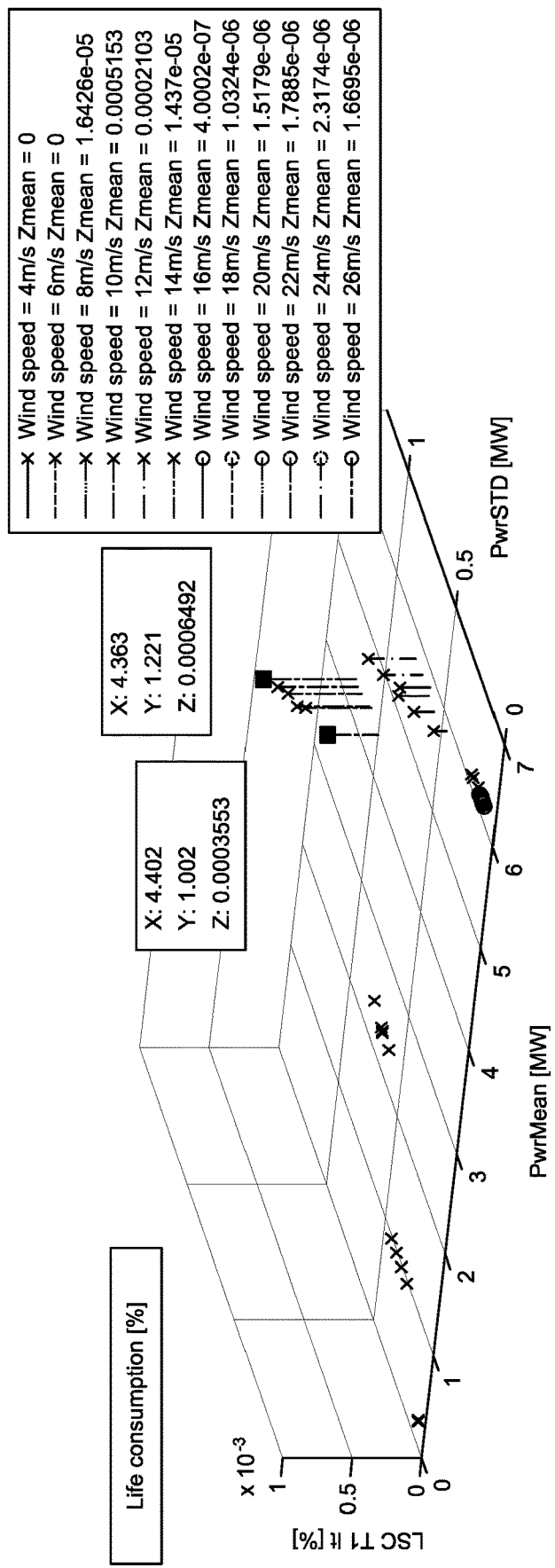
FIG. 5B is a graph illustrating life consumption in relation to a mean and a standard deviation calculated from the wind mission profile used to generate FIG. 5A.
Figure 5B:
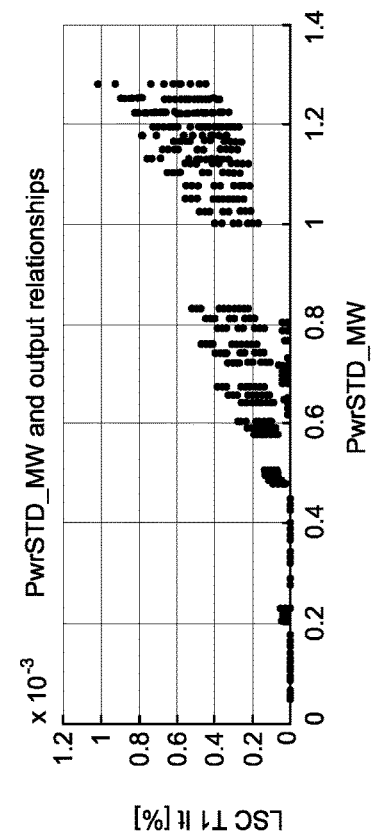
Figure 5B:
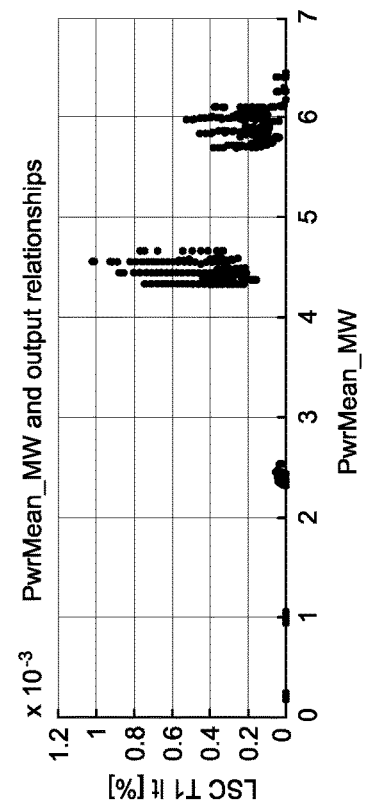

In addition to reducing computational burden and increasing computational speed, the low sampling rate operational data leveraged using the systems and methods describe herein correlates with life consumption and maximum junction temperatures. FIGS. 5A and 5B are graphs illustrating a maximum converter junction temperature (FIG. 5A) and life consumption (FIG. 5B) in relation to a mean value and a standard deviation calculated from a wind mission profile. The maximum converter junction temperatures and life consumption used in FIGS. 5A and 5B were obtained from physical-based converter life simulation results provided by the converter supplier. FIGS. 5A and 5B demonstrate that mean values and standard deviations calculated from wind mission profiles of active power data (sampled as 20 Hz) are good indicators of maximum converter IGBT junction temperatures (FIG. 5A) and life consumption (FIG. 5B) for a 10-minute time period. As the mean power increases, the maximum junction temperature increases (FIG. 5A), but life consumption does not necessarily increase (FIG. 5B). In comparison, as the standard deviation of power increases, the life consumption increases (FIG. 5B), but the maximum junction temperature (FIG. 5A) does not necessarily increase. These results demonstrate that life consumption highly depends on variations, i.e., thermal cycles, experienced by the semiconductor devices, while the maximum junction temperatures highly depend on mean values (see also FIGS. 3A and 3B).

Hybrid life estimation module 102 may also include fast transient OC life estimation module 110 to account for the effect of event signals on the life consumption of a wind converter. The fast transient OC life estimation module can be built using a physical-based model or a surrogate module, like in normal OC life estimation module. In the exemplary embodiment, the maximum junction temperature results outputted from normal OC life estimation module 108, together with low sampling rate operational data and event signals, are fed into a physical-based model in fast transient OC life estimation module 110 to estimate converter life consumption during fast transient OCs for each or selected converter component.

Figure 6A:
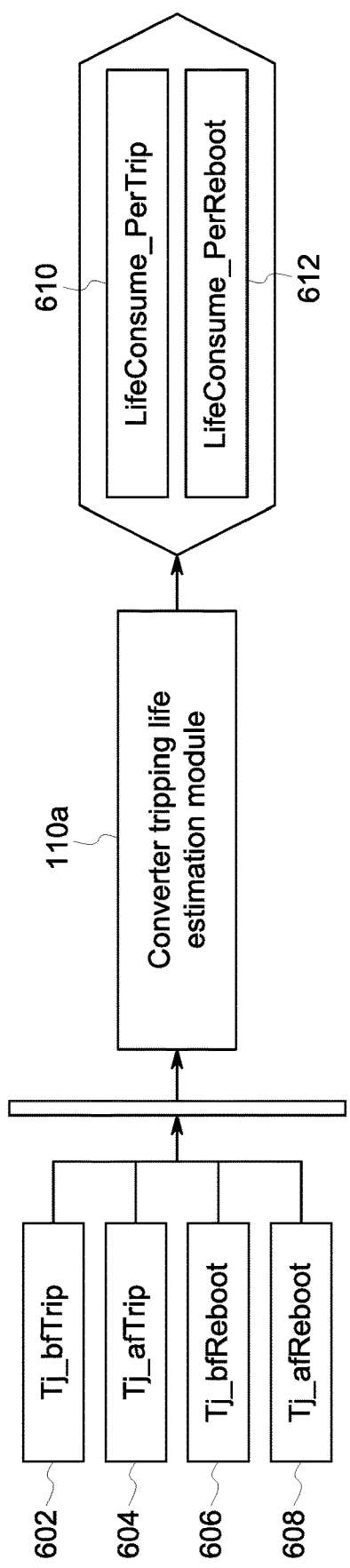
FIG. 6A is a diagram illustrating an exemplary process for calculating life consumption for converter fast transient conditions of converter tripping events.

FIG. 6A is a diagram illustrating an exemplary process for estimating life consumption using a physical-based model for fast transient OCs of converter tripping events. The process is carried out in converter tripping life estimation module 110a. The junction temperature before tripping or after reboot (602 and 608, respectively) is approximated using the maximum junction temperatures estimated by normal OC life estimation module 108. Converter ambient or coolant temperatures can be used to approximate the junction temperature after tripping or before reboot (604 and 606, respectively) because the time between tripping and rebooting is typically much larger than converter phase module's time constants. In estimating life consumption, converter tripping life estimation module 110a calculates outputs life consumption per trip 610 and life consumption per reboot 612. This module may also include calculation of the increase in max junction temperature caused by tripping current overshoot. If there are no converter tripping signals, life consumption due to tripping/rebooting events is assumed to be zero.

Figure 6B:
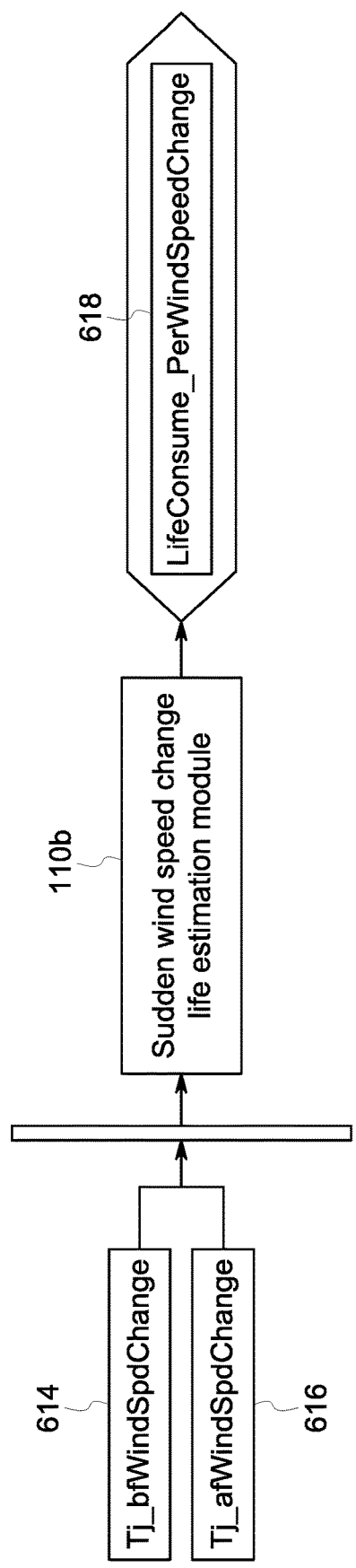
FIG. 6B is a diagram illustrating an exemplary process for calculating life consumption for converter fast transient conditions of sudden changes in wind speed.

FIG. 6B is a diagram illustrating an exemplary process for estimating life consumption using a physical-based model for fast transient conditions of sudden changes in wind speed. This process is carried out in sudden wind speed change life estimation module 110b. Event signals of sudden changes in wind speed or estimation of such sudden changes using operational data are inputted into sudden wind speed change life estimation module 110b for life estimation. Junction temperatures before and after a sudden change in wind speed (614 and 616, respectively) are approximated using maximum junction temperatures estimated by normal OC life estimation module 108. Sudden wind Speed change life estimation module 110b then outputs life consumption per sudden change in wind speed 618. If there is no detected sudden change in wind speed, life consumption estimation due to changes in wind speed is assumed to be zero.

In some embodiments, a surrogate model for fast transient operational conditions can be built directly instead of using physical-based models for fast transient operational conditions as described above. Either physical-based or surrogate models can be applied, as long as it can estimate life consumption during fast-transient OCs with sufficient accuracy and relatively light computational burdens by using low sampling rate operational data and event signals.

In the exemplary embodiment, once the converter life estimation during normal OCs (e.g., using a surrogate model) and fast-transient OCs (e.g. using a physical-based model) are completed, a hybrid wind converter life estimation or fused converter life consumption for one dataset, is obtained by fusing the life estimation results. Fused life consumption is computed by combining life consumption during normal OCs and life consumption during fast transient OCs. For a given snapshot of converter data collected at time t, with life consumption during normal OCs denoted as $\Delta LC_N(t)$, life consumption during converter tripping fast transient OCs denoted as $\Delta LC_{FT,1}(t)$, and life consumption during a sudden change in wind speed denoted as $\Delta LC_{FT,2}(t)$, the fused life consumption $\Delta LC(t)$ of the snapshot at time t is calculated as:

$$\Delta LC(t) = w_1(t) \cdot \Delta LC_N(t) + w_2(t) \cdot \Delta LC_{FT,1}(t) + w_3(t) \cdot \Delta LC_{FT,2}(t),$$

where $w_1$, $w_2$ and $w_3$ are weights associated with life consumption estimations during normal OCs, converter tripping, and events of sudden changes in wind speed, respectively, and $w_i \in [0,1]$, i=1, 2, 3. If there is no converter tripping event or sudden change in wind speed during this time period, $w_1(t)=1$, $w_2(t)=0$, and $w_3(t)=0$. The values of weights $w_1$ may be determined by the actual time duration for each OC during the entire time period, e.g., 10 minutes, at collection time point t for the given dataset. If more semiconductor devices included, life estimation is calculated for each device in hybrid life estimation module 102.

Figure 7:
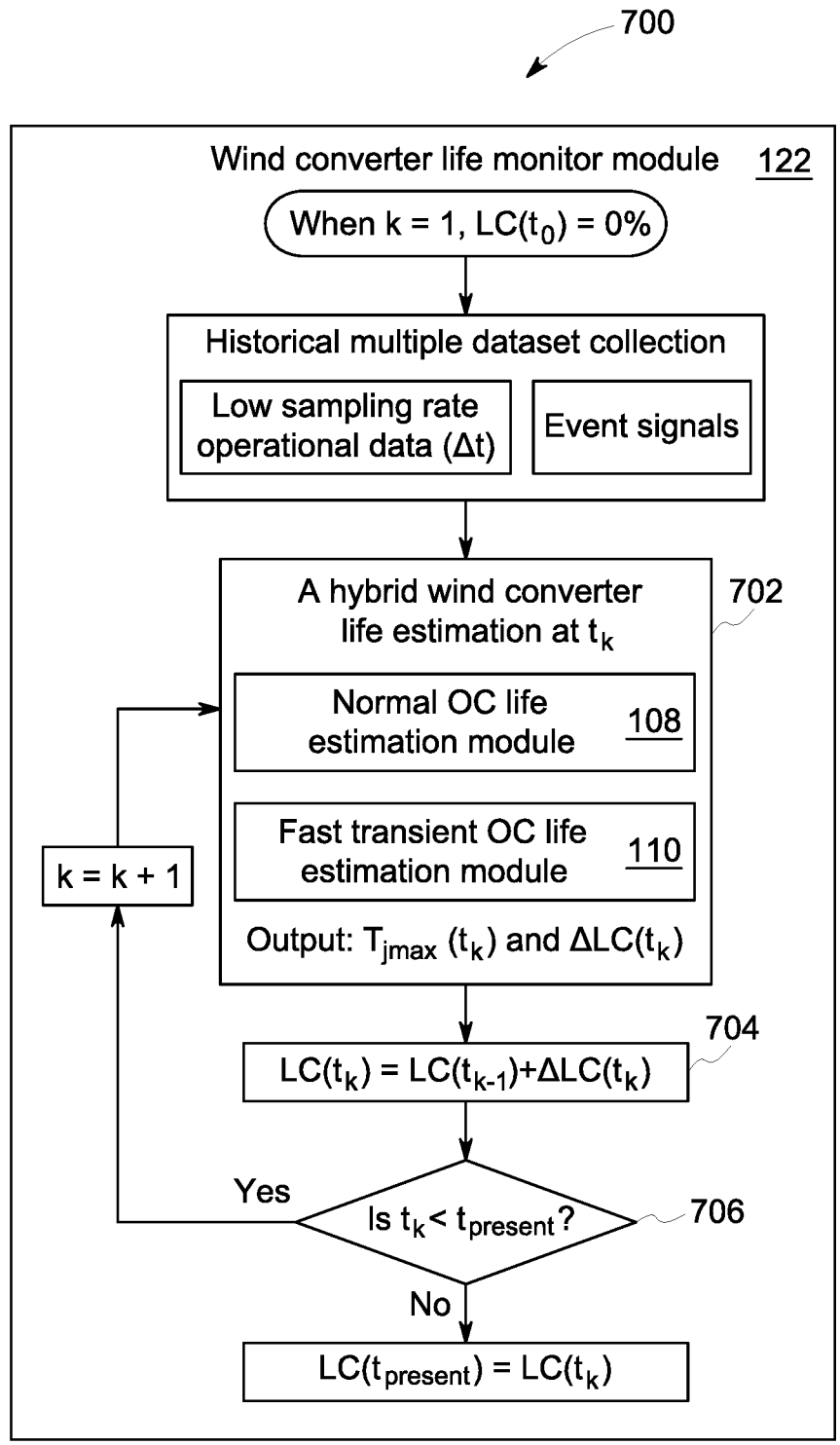
FIG. 7 is a schematic diagram illustrating an exemplary method of life monitoring a wind converter using the hybrid converter life estimation module shown in FIG. 2.

FIG. 7 is a schematic diagram illustrating an exemplary method 700 of monitoring a wind converter life using hybrid life estimation module 102. Method 700 may be applied online, where the method is web-based and takes in online-deposited data as input. Method 700 may also be implemented directly on a computing device, where the computing device receives and sends data wirelessly or via wired communication.

In method 700, life consumption (abbreviated as LC in FIG. 7) starts at 0%. Sets of converter operational data are collected at time points $t=t_0, t_1, t_2, \ldots, t_k, \ldots, t_{present}$. The operational data includes data for the wind converter's operational parameters. Each snapshot of operational data collected at time point $t_k$ may include low sampling rate converter operational data. The collected data may include at least a mean and a standard deviation (STD) for each time-varying quantity of the operational parameters, e.g. converter active power output (P), machine-side/line-side converter reactive power ($Q_{LSC}$ and $Q_{MSC}$), line-side alternating current (AC) root mean square (RMS) voltage ($U_{LSC}$), coolant temperature ($T_{coolant}$), coolant flow rate ($V_{coolant}$), and coolant ratio for mixed coolants ($R_{coolant}$) (see FIG. 2B). The data may also include event signals including converter tripping signals and/or signals indicating sudden changes in wind speed.

In the exemplary embodiment, method 700 further includes estimating 702 life consumption for a particular time point using hybrid life estimation module 102. The converter low sampling rate operational data and event signals are fed into hybrid life estimation module 102 to provide converter life estimation. The hybrid life estimation module 102 includes normal OC life estimation module 108. Normal OC life estimation module 108 is built using a surrogate model. In one example, normal OC life estimation module 108 using a surrogate model is trained and tested using training and testing datasets. Training and testing datasets may include low sampling rate operational data as inputs and life consumption as outputs during normal OCs. Training datasets may also include maximum junction temperatures as outputs. In some embodiments, life consumption and maximum junction temperatures are obtained from normal OC physical-based life estimation model 120 (shown in FIGS. 2A and 2B) using wind mission profiles and other operating/design parameters during normal OCs. The hybrid life estimation module 102 may further include fast transient OC life estimation module 110 to account for the effect of event signals on the life consumption of a wind converter. Fast transient OC life estimation module 110 may be built using a physical-based model or surrogate model. Additional event signals (e.g. converter tripping signal) or operational data processes might be needed to trigger the calculation for each converter life estimation for fast transient OCs.

Method 700 further includes computing 704 a total life consumption up to the time point $t=t_k$. Hybrid life estimation module 102 may further include a fused converter life estimation module, where it combines life estimation results from normal OC life estimation module 108 with fast transient OC life estimation module 110. In the contemplated embodiment, the life consumption for the $t=t_k$ snapshot ($\Delta LC(t_k)$) is then added to the total life consumption $LC(t_{k-1})$ up to the previous time point $t_{k-1}$ to compute the total life consumption $LC(t_k)$ up to $t=t_k$ based on a fatigue accumulation assumption, e.g. a linear fatigue accumulation assumption. That is, the total life computation $LC(t_k)$ is calculated as:

$$LC(t_k)=LC(t_{k-1})+\Delta LC(t_k)$$

Different fatigue accumulation assumptions, such as a nonlinear fatigue accumulation assumption, may be used in estimating the total life consumption.

Method 700 also includes comparing 706 the time point $t_k$ of the snapshot with the present time point $t_{present}$ (or the time point of interest) to determine whether to proceed to the next snapshot or stop the computation and output the total life consumption. In one example, if $t_k < t_{present}$, k=k+1, estimating 702, computing 704, and comparing 706 are repeated to compute life consumption for the snapshot at $t=t_{k+1}$. If $t_k \geq t_{present}$, it indicates that all snapshots have been processed, and LC ($t_{present}$)=$LC(t_k)$ is provided as the total life consumption for monitoring the operation of the wind converter. In the exemplary embodiment, in monitoring life performance of the wind converter, if more than one semiconductor device is included, life estimation results ($T_{jmax}$ and LC) for each device are calculated.

System 100 may include converter RUL prediction module 104 to estimate an RUL and, may further include active life performance control module 106 based on the estimated RUL. Instead of providing life consumption as a percentage of the total life of the wind converter, converter RUL prediction module 104 predicts the RUL as a duration of time, for example, in units of months or years.

Figure 8A:
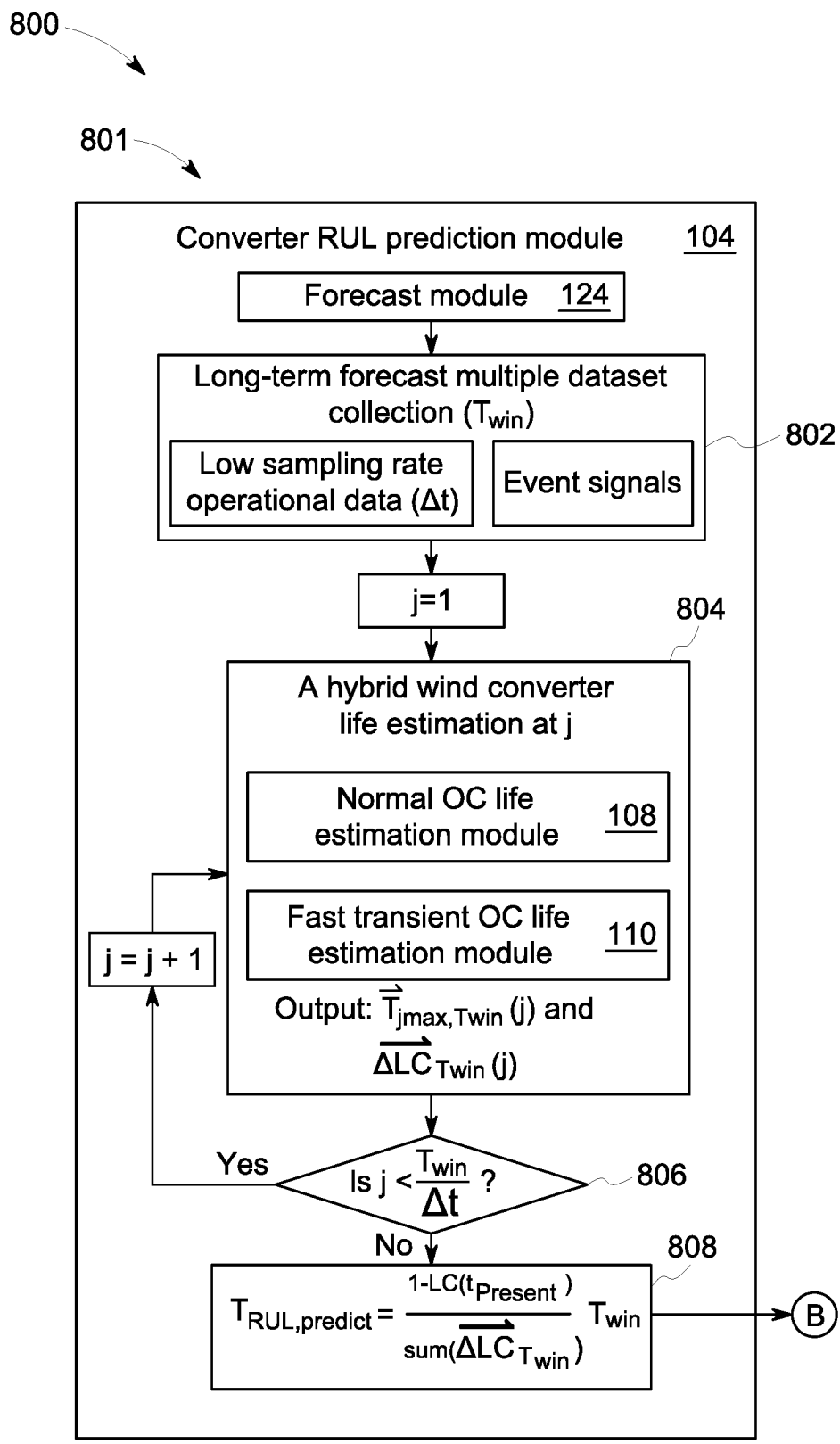
FIG. 8A is an exemplary flow chart for an exemplary method of predicting a remaining useful life of a wind converter.

FIG. 8A is an exemplary flow chart for an exemplary method 800 of operating a wind converter. Method 800 may be applied online, where the method is web-based and takes in online-deposited data as input. Method 800 may also be implemented directly on a computing device, where the computing device receives and sends data wirelessly or via wired communication. Method 800 includes predicting 801 an RUL of the wind converter and controlling 850 operation of the wind converter by adjusting operating variables of the wind converter based on the comparison of the predicted RUL to a target RUL.

In the exemplary embodiment, method 801 includes providing 802 forecasted wind datasets. In forecast module 124, forecasted datasets are generated using a forecast function to lengthen the time series of the operational data and event signals such that the forecasted datasets have a relatively long total time period of $T_{win}$. $T_{win}$ may be, for example, in the range of months or years. Each snapshot of the generated forecasted wind dataset over $T_{win}$ includes low sampling rate operational data (for a time interval of $\Delta t$) and event signals over that time interval.

In the exemplary embodiment, method 801 further includes computing 804 a life consumption for snapshot j using a hybrid life estimation module 102. Each snapshot of forecasted converter low sampling rate operational data is fed into normal OC life estimation module 108 using a surrogate module in hybrid life estimation module 102 to provide converter life estimation during normal OCs at each snapshot j. The max junction temperature results $\vec{T}_{jmax, T_{win}}(j)$ obtained from normal OC life estimation module 108, possible converter event signals, and low sampling rate operational data are then fed into fast transient OC life estimation module 110 in the hybrid life estimation module 102 for converter life estimation during fast transient OCs. Either a physical-based model or a surrogate model may be built in module 110, as long as it can estimate life consumption during fast-transient OCs with sufficient accuracy and relatively light computational burdens by using low sampling rate operational datasets and event signals. The estimated life consumption during normal OCs and the estimated life consumption during fast transient OCs may be combined in the hybrid life estimation module 102.

In the exemplary embodiment, method 801 further includes comparing 806 index j with $$\frac{T_{win}}{\Delta t},$$

If $$j < \frac{T_{win}}{\Delta t},$$

j=j+1, and the next snapshot j+1 is processed, where computing 804 using a hybrid life estimation module 102 is repeated for snapshot j+1. Otherwise, all snapshots in the datasets have been processed and method 801 proceeds to computing 808 a predicted RUL.

In the exemplary embodiment, the predicted RUL is computed 808 using the equation below, based on a linear fatigue accumulation assumption.

$$T_{RUL,predict} = \frac{1 - LC(t_{present})}{\text{sum}(\overrightarrow{\Delta LC}_{T_{win}})} T_{win}.$$

Here, $\text{sum}(\overrightarrow{\Delta LC}_{T_{win}})$ is the total life consumption for the entire time duration of $T_{win}$. Different fatigue accumulation assumptions, such as a nonlinear fatigue accumulation assumption, may also be used to compute a predicted RUL.

Figure 8B:
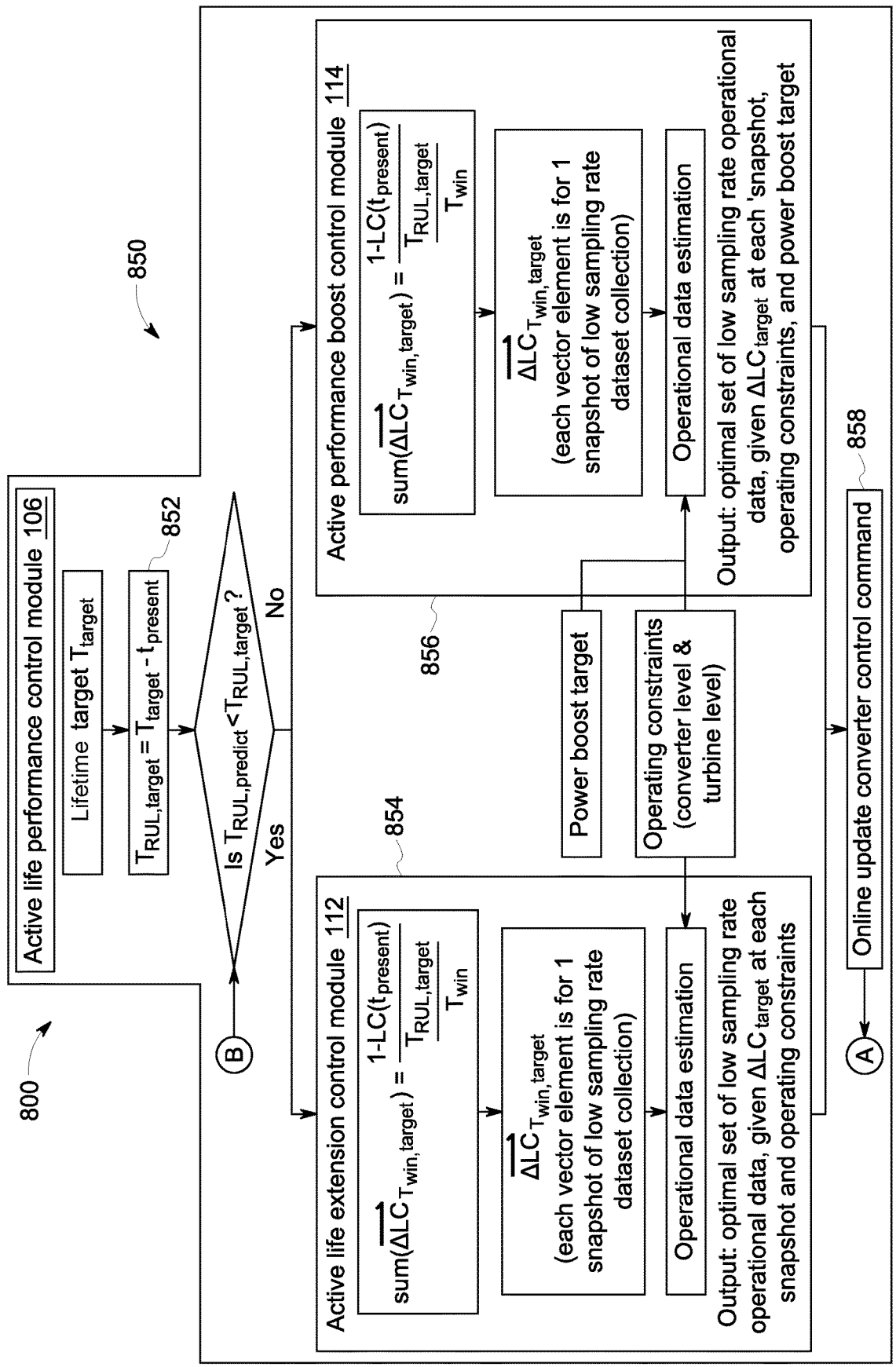
FIG. 8B is an exemplary flow chart for another exemplary method of controlling operation of a wind converter.

In the exemplary embodiment, method 800 may further include method 850 of controlling wind converter active life performance. FIG. 8B shows an exemplary flow chart of method 850. Method 850 is used to control performance of a wind converter by adjusting operating variables of the wind converter based on the predicted RUL predicted by method 801. Method 850 may be implemented using active life performance control module 106.

In the exemplary embodiment, method 850 includes calculating 852 a target RUL using the equation below.

$$T_{RUL,target} = T_{target} - t_{present},$$

where $T_{target}$ represents a target life and may be provided by the OEM, and $t_{present}$ represents the present time (or time of interest) obtained from converter life monitor module 122. The calculated target RUL $T_{RUL,target}$ is then compared with the RUL $T_{RUL,predict}$ predicted by method 801. If $T_{RUL,predict} < T_{RUL,target}$, the predicted converter life does not satisfy the target (e.g., the converter stress or usage is relatively high), and method 850 proceeds to reducing 854 future life consumption using active life extension control module 112. If $T_{RUL,predict} > T_{RUL,target}$, the predicted converter life satisfies the target (e.g., the converter stress or usage is relatively low), and it is possible to boost converter power and increase future life consumption while maintaining all other converter-level and turbine-level operational constraints. Accordingly, method 850 includes boosting 856 performance of the converter using active performance boost control module 114 in this scenario.

In the exemplary embodiment, to reduce 854 future life consumption, active life extension control module 112 is used to meet the target life time. First, $T_{RUL, target}$ and present life consumption $LC(t_k)$ are used to calculate the target total life consumption for time period as $\text{sum}(\Delta LC_{T_{win},target})$ using the equation shown below, which is the vector summation of the life consumption vector $\overrightarrow{\Delta LC}_{T_{win},target}$ that has $$\frac{T_{win}}{\Delta t}$$

number of elements representing target life consumption at each time interval $\Delta t$:

$$\text{sum}(\overrightarrow{\Delta LC}_{T_{win}}, \text{target}) = \frac{1 - LC(t_{present})}{\frac{T_{RUL,target}}{T_{win}}}.$$

Target life consumption for each element of time period $T_{win}$, i.e., for each snapshot of the datasets, is then calculated.

In the exemplary embodiment, for each snapshot of low sampling rate dataset with time interval $\Delta t$, an operational data estimation function is used to calculate an optimal set of operational data input, given $\Delta LC_{target}$ at each snapshot and operating constraints at the converter level and the turbine level. In achieving the target life consumption target, a minimal impact on converter performance should be realized. Optimal values for relevant operating variables, including, e.g., converter active power, reactive power, voltage, and coolant temperature, are determined based on the target life consumption and constraints of converter performance. This problem is solved by using a static constrained optimizer (represented by the following equation) at each snapshot, or a dynamic constrained optimizer such as model predictive control:

$$\min_{xc}\{c_1 * \|\Delta LC_{target} - \Delta LC_{est}\|^2 + c_2 * \|PF_{target} - PF_{est}\|^2\},$$

where $\Delta LC_{est} = f_1(xc, xnc)$, and $PF_{est} = f_2(xc, xnc)$, $c_1$ is the cost-related penalty coefficient for deviation from target life consumption, and $c_2$ is the cost penalty coefficient related to the performance violation.

The above function ensures that the active life extension control module considers both the operational life consumption and performance constraints. In estimating optimal life consumption $\Delta LC_{est}$ for each time interval $\Delta t$, the hybrid life estimation module 102 can be reused in computing 804 life consumption. $\Delta LC_{est}$ is a function of operational parameters and design parameters. In this optimization context, xc represents controllable operating parameters related to converter life, which are also the decision variable for the optimization problem. xnc represents non-controllable parameters affecting converter life and performance, including design parameters and non-controllable operating parameters. Non-controllable operating parameters are not adjustable due to device malfunction or failure, for example. Likewise, $PF_{est}$ is based on a similar surrogate model to convert operating parameters to converter performance constraints. With the objective function, constraints, and decision variables all defined, any standard nonlinear least squares algorithm may be used, such as Gaussian-Newton Method, Levenberg-Marquardt algorithm, conjugate gradient search, and Nelder-Mead (simplex) search, to derive optimal operating variables. The optimization problem can also be solved using a moving horizon technique with a standard model predictive control package.

The above optimization framework can be used for both life extension and performance boost control as described below.

In the exemplary embodiment, in boosting 856 performance, active performance boost control module 114 is used to boost power output, while still enabling the converter to meet the target life time. First, $T_{RUL, target}$ and present life consumption $LC(t_k)$ are used to calculate target total life consumption for time period $T_{win}$.

$$\text{sum}(\overrightarrow{\Delta LC}_{T_{win}}, \text{target}) = \frac{1 - LC(t_{present})}{\frac{T_{RUL,target}}{T_{win}}}.$$

Target life consumption for each element of time period i.e., for each snapshot of the datasets, is then calculated.

In the exemplary embodiment, for each snapshot of minute-level dataset, an operational data estimation function is used to calculate the optimal set of operational data input, given $\Delta LC_{target}$ at each snapshot, other operational targets (e.g., power boost target), and operating constraints at the converter level and the turbine level for devices including generators, cables, and transformers. This solution can be obtained from a static constrained optimizer, or a dynamic constrained optimizer such as a model predictive control as described in reducing 854 future life consumption.

Method 850 may further include online updating 858 of converter control command based on optimal operating variables obtained in either reducing 854 future life consumption through active life extension control module 112 or boosting 856 performance through active performance boost control module 114. A control feedback loop may be realized by adjusting wind converter operating variables using active life performance control module 106. In one example, if more semiconductor devices are included, the optimal operating variables are determined based on a semiconductor device that consumes the most life among the included devices.

Active life performance control module 106 seamlessly integrates a "life extension control mode" (if stress or usage is relatively high) and a "performance boost control mode" (if stress or usage is relatively low). Active life performance control module 106 can also automatically switch between the two modes in real-time based on customer needs and/the predicted RUL results.

In some embodiments, system 100 is integrated with life models of other wind turbines or converters in a fleet, and facilitates balancing power among the wind converters to realize homogenous aging of the fleet based on the target life for the entire fleet.

Figure 9:
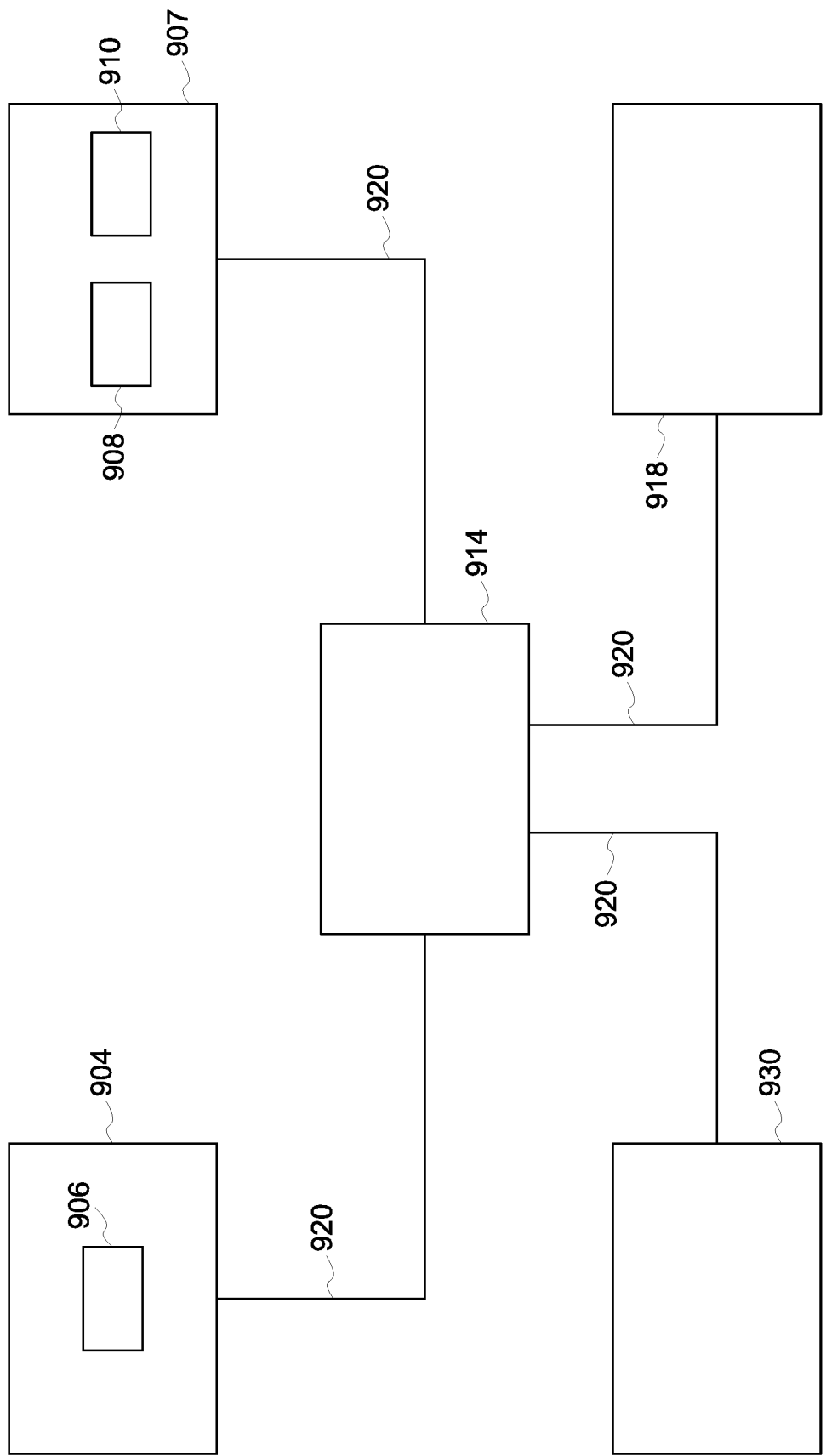
FIG. 9 is a block diagram of an exemplary computing device.

The modules described herein may be implemented on any suitable computing device and software implemented therein. FIG. 9 is a block diagram of an exemplary computing device 900. In the exemplary embodiment, computing device 900 includes a user interface 904 that receives at least one input from a user. User interface 904 may include a keyboard 906 that enables the user to input pertinent information. User interface 904 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 900 includes a presentation interface 907 that presents information, such as input events and/or validation results, to the user. Presentation interface 907 may also include a display adapter 908 that is coupled to at least one display device 910. More specifically, in the exemplary embodiment, display device 910 may be a visual display device, such as a cathode ray tube (CRT), a liquid crystal display (LCD), an organic LED (OLED) display, and/or an "electronic ink" display. Alternatively, presentation interface 907 may include an audio output device (e.g., an audio adapter and/or a speaker) and/or a printer.

Computing device 900 also includes a processor 914 and a memory device 918. Processor 914 is coupled to user interface 904, presentation interface 907, and memory device 918 via a system bus 920. In the exemplary embodiment, processor 914 communicates with the user, such as by prompting the user via presentation interface 907 and/or by receiving user inputs via user interface 904. The term "processor" refers generally to any programmable system including systems and microcontrollers, reduced instruction set circuits (RISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, memory device 918 includes one or more devices that enable information, such as executable instructions and/or other data, to be stored and retrieved. Moreover, memory device 918 includes one or more computer readable media, such as, without limitation, dynamic random access memory (DRAM), static random access memory (SRAM), a solid state disk, and/or a hard disk. In the exemplary embodiment, memory device 918 stores, without limitation, application source code, application object code, configuration data, additional input events, application states, assertion statements, validation results, and/or any other type of data. Computing device 900, in the exemplary embodiment, may also include a communication interface 930 that is coupled to processor 914 via system bus 920. Moreover, communication interface 930 is communicatively coupled to data acquisition devices.

In the exemplary embodiment, processor 914 may be programmed by encoding an operation using one or more executable instructions and providing the executable instructions in memory device 918. In the exemplary embodiment, processor 914 is programmed to select a plurality of measurements that are received from data acquisition devices or wind converters.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) real-time monitoring of the performance of a wind converter; (b) using low sampling rate operational data to ease computational burdens and increase the computational speeds; (c) controlling the performance of a wind converter in real-time to prolong its life or to maximize its performance while still meeting a target life; and (d) using existing available operational data and obviating the need to use loss/thermal parameters or additional hardware.

Exemplary embodiments of systems and methods of operating a wind converter are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of operating a wind converter, said method comprising:
receiving a plurality of current datasets, wherein the plurality of datasets include event signals for the wind converter during fast transient operating conditions (OCs) and operational data points for the wind converter having a first sampling rate on an order of minutes and based on underlying operational data having a second higher sampling rate on an order of seconds or sub-seconds;
wherein the operational data points for the wind converter are operating parameter quantities of one or more of converter active power output (P), machine-side/line-side converter reactive power ($Q_{LSC}$ and $Q_{MSC}$), line-side alternating current root mean square voltage ($U_{LSC}$), coolant temperature ($T_{coolant}$), coolant flow rate ($V_{coolant}$), or coolant ratio for mixed coolants ($R_{coolant}$);
wherein the event signals for the wind converter include converter tripping signals and sudden changes in wind speed;
providing a real-time life monitoring function by:
with a first hybrid life estimation module, estimating, using a normal OC life estimation module, a converter life consumption during normal OCs based on the operational data points;
with the first hybrid life estimation module, estimating, using a fast transient OC life estimation module, a converter life consumption during the fast transient OCs based on the event signals;
computing at each sampling time of the first sampling rate, using the first hybrid life estimation module, a real-time total converter life consumption of the wind converter by combining the estimated converter life consumption during the normal OCs and the estimated converter life consumption during the fast transient OCs;
using a remaining useful life (RUL) prediction module, providing a predicted RUL for the wind converter by:
applying a forecast function to the operational data points and the event signals to generate predicted future values of the operational data points and event signals;
providing the predicted future values of the data points and event signals to a second hybrid life estimation module;
with the second hybrid life estimation module, computing an RUL total converter life consumption of the wind converter based on the predicted future values for the operational data points and event signals, the predicted RUL based on the RUL total converter life consumption and a sum of life consumption values calculated over a period of time corresponding to a window of predicted future values;
comparing the predicted RUL with a target RUL for the wind converter;
adjusting, using an active life performance control module, operation of the wind converter based on the comparison by adjusting operating variables of the wind converter;
estimating, using the normal OC life estimation module, a maximum junction temperature of the wind converter during the normal OCs, wherein:
estimating a converter life consumption during fast transient OCs further comprises estimating, using the fast transient OC life estimation module, the converter life consumption during the fast transient OCs based also on the operational data and the estimated maximum junction temperature of the wind converter during the normal OCs; and
wherein the predicted RUL for the wind converter based on the RUL total converter life consumption is determined based on assigning a higher converter life consumption during periods of lower mean converter power and higher converter power deviation as compared to periods of higher mean converter power and lower converter power deviation.

2. The method in accordance with claim 1, wherein adjusting operation of the wind converter further comprises:
adjusting, using an active life extension control module, when the predicted RUL is less than the target RUL, operating variables of the wind converter to reduce a future life consumption such that the wind converter meets a target converter life; and
adjusting, using an active performance boost control module, when the predicted RUL is greater than the target RUL, the operating variables to boost performance and increase the future life consumption while still meeting the target converter life.

3. The method in accordance with claim 2, wherein adjusting operation of the wind converter further comprises switching between the active life extension control module and the active performance boost control module.

4. The method in accordance with claim 1, wherein the target RUL is based on a target converter life for a fleet of wind converters including the wind converter.

5. The method in accordance with claim 1, wherein the operational data points includes statistics associated with the operating parameters of the wind converter.

6. The method in accordance with claim 5, wherein the statistics include at least one of a mean, a standard deviation, a kurtosis, a skewness, a mode, a median, a quartile, a minimum, a maximum, a range, and an interquartile range of each of the operating parameters.

7. The method in accordance with claim 1, wherein the normal OC life estimation module includes a surrogate model that is trained using a plurality of training datasets, with first operational data having the first sampling rate as inputs and life consumptions estimated using a normal OC physical-based life estimation model as outputs.

8. The method in accordance with claim 1, wherein computing a total converter life consumption further comprises computing the total converter life consumption by computing a weighted sum of the estimated converter life consumption during the normal OCs and the estimated converter life consumption during the fast transient OCs.

9. A real-time remote operation monitor and control system of a wind converter, comprising:

a wind converter;

a wind converter life monitor module comprising a first hybrid life estimation module;

a remaining useful life (RUL) prediction module comprising a second hybrid life estimation module;

the first and second hybrid life estimation modules configured to receive a plurality of current datasets, wherein the plurality of datasets include event signals for said wind converter during fast transient operating conditions (OCs) and operational data points of said wind converter having a sampling first sampling rate on an order of minutes and based on underlying operational data having a second lower sampling rate on an order of seconds or sub-seconds;

wherein the operational data points for the wind converter are operating parameter quantities of one or more of converter active power output (P), machine-side/line-side converter reactive power ($Q_{LSC}$ and $Q_{MSC}$), line-side alternating current root mean square voltage ($U_{LSC}$), coolant temperature ($T_{coolant}$), coolant flow rate ($V_{coolant}$), or coolant ratio for mixed coolants ($R_{coolant}$);

wherein the event signals for the wind converter include converter tripping signals and sudden changes in wind speed;

each of the first and second hybrid life estimation modules comprising:

a normal OC life estimation module configured to estimate a converter life consumption during normal OCs based on the operational data points; and a fast transient OC life estimation module configured to estimate a converter life consumption during the fast transient OCs based on the plurality of datasets;

wherein the first hybrid life estimation module is further configured to compute a real-time total converter life consumption of said wind converter at each sampling time of the first sampling rate by combining the estimated converter life consumption during the normal OCs and the estimated converter life consumption during the fast transient OCs;

wherein said RUL prediction module is configured to predict an RUL for said wind converter by:

applying a forecast function to the operational data points and the event signals to generate predicted future values of the operational data points and event signals;

providing the predicted future values of the data points and event signals to the normal OC life estimation module and the fast transient OC life estimation module;

with the second hybrid life estimation module, computing an RUL total converter life consumption of the wind converter based on the predicted future values for the operational data points and event signals, the predicted RUL based on the RUL total converter life consumption and a sum of life consumption values calculated over a period of time corresponding to a window of predicted future values;

an active life performance control module configured to adjust operation of said wind converter based on a comparison of the predicted RUL with a target RUL for said wind converter by adjusting operating variables of said wind converter; wherein said normal OC life estimation module is further configured to estimate a maximum junction temperature of said wind converter during the normal OCs;

said fast transient OC life estimation module is configured to estimate the converter life consumption during the fast transient OCs based on the event signals, the operational data, and the maximum junction temperature of said wind converter during the normal OCs estimated using said normal OC life estimation module; and wherein the RUL prediction module further predicts the RUL for the wind converter based on a higher converter life consumption existing during periods of lower mean converter power and higher converter power deviation as compared to periods of higher mean converter power and lower converter power deviation.

10. The system in accordance with claim 9, wherein said normal OC life estimation module further comprises a surrogate model, wherein said surrogate model is trained by using a plurality of training datasets, with first operational data having the first sampling rate as inputs and converter life consumptions estimated using a normal OC physical-based life estimation model as outputs.

11. The system in accordance with claim 9, wherein said active life performance control module further comprises:

an active life extension control module configured to adjust, when the predicted RUL is less than the target RUL, operating variables of said wind converter to reduce future life consumption such that said wind converter meets a target converter life; and an active performance boost control module configured to adjust, when the predicted RUL is greater than the target RUL, the operating variables to boost performance and increase the future life consumption while still meeting the target converter life.

12. The system in accordance with claim 11, wherein said active life performance control module is configured to switch between said active life extension control module and said active performance boost control module.

* * * * *